US012751265B2

(12) United States Patent
Kong et al.

(10) Patent No.: US 12,751,265 B2

(45) Date of Patent: Sep. 29, 2026

(54) VERTICAL SEMICONDUCTOR DEVICES

(71) Applicant: Samsung Electronics Co., Ltd., Suwon-si (KR)

(72) Inventors: Myungho Kong, Hwaseong-si (KR); Sukhoon Kim, Hwaseong-si (KR); Hoon Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 657 days.

(21) Appl. No.: 18/055,530

(22) Filed: Nov. 15, 2022

(65) Prior Publication Data

US 2023/0238330 A1 Jul. 27, 2023

(30) Foreign Application Priority Data

Jan. 25, 2022 (KR) ........................ 10-2022-0010692

(51) Int. Cl.

| | |
|---|---|
| ***H10B 43/27*** | (2023.01) |
| ***H10B 43/40*** | (2023.01) |
| ***H10W 20/20*** | (2026.01) |
| ***H10W 20/41*** | (2026.01) |
| ***H10W 20/44*** | (2026.01) |

(52) U.S. Cl.

CPC ............ *H10W 20/20* (2026.01); *H10B 43/27* (2023.02); *H10B 43/40* (2023.02); *H10W 20/425* (2026.01); *H10W 20/4403* (2026.01)

(58) Field of Classification Search

CPC ........ H10B 43/10; H10B 43/27; H10B 43/40; H10B 43/20; H10B 43/30; H01L 23/53209; H01L 23/53252; H01L 23/535; H01L 23/53266

See application file for complete search history.

(56) References Cited

U.S. PATENT DOCUMENTS 10,559,497 B2 2/2020 Wu et al.
10,580,650 B2 3/2020 O'Meara et al.
10,727,065 B2 7/2020 Su et al.
(Continued)

FOREIGN PATENT DOCUMENTS

KR 10-2014-0117212 A 10/2014

OTHER PUBLICATIONS

Notice of Allowance in Korean Appln. No. KR 10-2022-0010692, mailed on Apr. 9, 2026, 5 pages (with English translation).

*Primary Examiner* — Tony Tran

(74) *Attorney, Agent, or Firm* — Fish & Richardson P.C.

(57) ABSTRACT

A vertical semiconductor device includes insulation patterns, channel structures, a first metal pattern structure and a second metal pattern. The insulation patterns are spaced apart from each other in a vertical direction. Each insulation pattern extends in a first direction parallel to the upper surface of a substrate. The channel structures pass through the insulation patterns. The first metal pattern structure include at least one first metal material, and extend in the first direction. The first metal pattern structure are positioned in a gap between adjacent insulation patterns in the vertical direction, and the first metal pattern structure is at a central portion of the gap. The second metal pattern includes a metal material that is different from the at least one first metal material, the second metal pattern may be on opposite sidewalls of the first metal pattern structure to fill a remainder portion of the gap.

17 Claims, 31 Drawing Sheets

(56) References Cited

U.S. PATENT DOCUMENTS

| | | | |
|---|---|---|---|
| 10,756,110 | B1 | 8/2020 | Sharangpani et al. |
| 10,770,473 | B2 | 9/2020 | Lee et al. |
| 10,879,370 | B2 | 12/2020 | Lim et al. |
| 10,923,573 | B2 | 2/2021 | Wang et al. |
| 11,024,535 | B2 | 6/2021 | Yu et al. |
| 11,075,115 | B2 | 7/2021 | Chandrashekar et al. |
| 11,094,546 | B2 | 8/2021 | Longrie et al. |
| 2017/0345839 | A1* | 11/2017 | Han .................. H01L 21/76877 |
| 2021/0090948 | A1 | 3/2021 | Chen et al. |
| 2021/0288086 | A1 | 9/2021 | Li et al. |

* cited by examiner

VERTICAL SEMICONDUCTOR DEVICES

CROSS-REFERENCE TO RELATED APPLICATION

This application claims priority under 35 USC § 119 to Korean Patent Application No. 10-2022-0010692, filed on Jan. 25, 2022, in the Korean Intellectual Property Office (KIPO), the contents of which are incorporated by reference herein in their entirety.

BACKGROUND

1. Field

Example embodiments relate to semiconductor devices and methods for manufacturing the same. More particularly, example embodiments relate to vertical semiconductor devices and methods for manufacturing the same.

2. Description of the Related Art

Recently, a vertical semiconductor device in which memory cells are vertically stacked on a substrate has been developed. Each of the memory cells may include gate structures stacked in a vertical direction. However, as a distance in the vertical direction between the stacked memory cells decreases, it may be difficult to form normal gate structures.

SUMMARY

Some example embodiments provide a vertical semiconductor device including stacked gate structures.

According to some example embodiments, a vertical semiconductor device may include insulation patterns, channel structures, a first metal pattern structure and a second metal pattern. The insulation patterns may be spaced apart from each other in a vertical direction perpendicular to an upper surface of a substrate. Each of the insulation patterns may extend in a first direction parallel to the upper surface of the substrate. The channel structures may be on the substrate. The channel structures may pass through the insulation patterns. The first metal pattern structure may include at least one first metal material, and may extend in the first direction. The first metal pattern structure may be located in a gap at least partially defined between adjacent insulation patterns of the insulation patterns in the vertical direction. The second metal pattern may include a metal material different from the first metal material. The second metal pattern may be on opposite sidewalls of the first metal pattern structure in a second direction perpendicular to the first direction and parallel to the upper surface of the substrate, wherein the first metal pattern structure is at a central portion of the gap and the second metal pattern at least partially fills a remainder portion of the gap on opposite sides of the central portion in the second direction, such that the first metal pattern structure is between separate portions of the second metal pattern in the second direction.

According to some example embodiments, a vertical semiconductor device may include insulation patterns, channel structures, a blocking dielectric layer, a first metal pattern structure and a second metal pattern. The insulation patterns may be spaced apart from each other in a vertical direction perpendicular to an upper surface of a substrate. Each of the insulation patterns may extend in a first direction parallel to the upper surface of the substrate. The channel structures may be on the substrate. The channel structures may pass through the insulation patterns. The blocking dielectric layer may be conformally on surfaces of the insulation patterns and sidewalls of the channel structure in a gap between adjacent insulation patterns of the insulation patterns in the vertical direction. The first metal pattern structure may include a first barrier metal pattern and a first metal pattern. The first metal pattern may extend in the first direction. The first barrier metal pattern may surround at least a partial surface of the first metal pattern. The second metal pattern may be on each of opposite sidewalls of the first metal pattern structure in a second direction perpendicular to the first direction and parallel to the upper surface of the substrate, wherein the first metal pattern structure is at a central portion of the gap and the second metal pattern at least partially fills a remainder portion of the gap on opposite sides of the central portion in the second direction, such that the first metal pattern structure is between separate portions of the second metal pattern in the second direction. One sidewall of the second metal pattern may contact the first metal pattern structure, and upper and lower surfaces of the second metal pattern may contact the blocking dielectric layer, respectively.

According to some example embodiments, a vertical semiconductor device may include a lower circuit pattern, a common electrode plate, insulation patterns, channel structures, a blocking dielectric layer, a first metal pattern structure and a second metal pattern. The lower circuit pattern may be on a substrate. The common electrode plate may be on the lower circuit pattern. The insulation patterns may be on the common electrode plate. The insulation patterns may be spaced apart from each other in a vertical direction perpendicular to an upper surface of the substrate. Each of the insulation patterns may extend in a first direction parallel to the upper surface of the substrate. The channel structures may be connected to the common electrode plate through the insulation patterns. Each of the channel structures may include a channel extending in the vertical direction and a charge storage structure surrounding an outer wall of the channel. The blocking dielectric layer may be conformally on surfaces of the insulation patterns and sidewalls of the channel structure in a gap between the insulation patterns adjacent in the vertical direction. The first metal pattern structure may include at least one first metal material and may extend in the first direction. The first metal pattern structure may be located in a gap between adjacent insulation patterns of the insulation patterns in the vertical direction. The second metal pattern may include a metal material different from the first metal material. The second metal pattern may be formed on opposite sidewalls of the first metal pattern structure in a second direction perpendicular to the first direction and parallel to the upper surface of the substrate, wherein the first metal pattern structure is at a central portion of the gap and the second metal pattern at least partially fills a remainder portion of the gap on opposite sides of the central portion in the second direction, such that the first metal pattern structure is between separate portions of the second metal pattern in the second direction. One sidewall of the second metal pattern may contact the first metal pattern structure, and upper and lower surfaces of the second metal pattern may contact the blocking dielectric layer, respectively. Outer walls of one of the channel structures in the gap may be surrounded by only the second metal pattern.

In the vertical semiconductor device according to some example embodiments, the gate structure including the first metal pattern structure and the second metal pattern may be formed in the gap between the insulation patterns stacked. The second metal pattern may be formed on both sidewalls of the first metal pattern structure, respectively, and upper and lower surfaces of the second metal pattern may contact insulation material. The second metal pattern may include a metal material deposited using the sidewalls of the first metal pattern structure as seed. The second metal pattern may be formed by selectively depositing in a lateral direction, i.e., a direction being perpendicular to the sidewalls of the first metal pattern structure. As the second metal pattern may be formed by selectively depositing only in the lateral direction, voids may not be formed in the second metal pattern. Therefore, a defect in which the insulation pattern is inclined or bent due to the void in the second metal pattern may be decreased or prevented, thereby improving the performance and/or reliability of the vertical semiconductor device. As the void in the second metal pattern may be decrease, the gate structure may have a low resistance.

BRIEF DESCRIPTION OF THE DRAWINGS

Example embodiments will be more clearly understood from the following detailed description taken in conjunction with the accompanying drawings.

FIG. 1 is a block diagram of a vertical semiconductor device in accordance with some example embodiments;

FIG. 2 is a block diagram illustrating an electronic system including a semiconductor device in accordance with some example embodiments;

FIG. 3 is a schematic perspective view illustrating an electronic system including a semiconductor device in accordance with some example embodiments;

FIGS. 4, 5, 6, 7, 8, 9, 10, 11, 12, 13, 14, 15, 16, 17, 18, 19, 20, 21, 22, 23, 24, 25, and 26 are cross-sectional views illustrating a method of manufacturing a vertical semiconductor device in accordance with some example embodiments;

FIGS. 27 and 28 are a cross-sectional view and an enlarged cross-sectional view of a vertical semiconductor device in accordance with some example embodiments; and FIGS. 29, 30, and 31 are cross-sectional views illustrating a method of manufacturing a vertical semiconductor device in accordance with some example embodiments.

DETAILED DESCRIPTION

Figure 1:
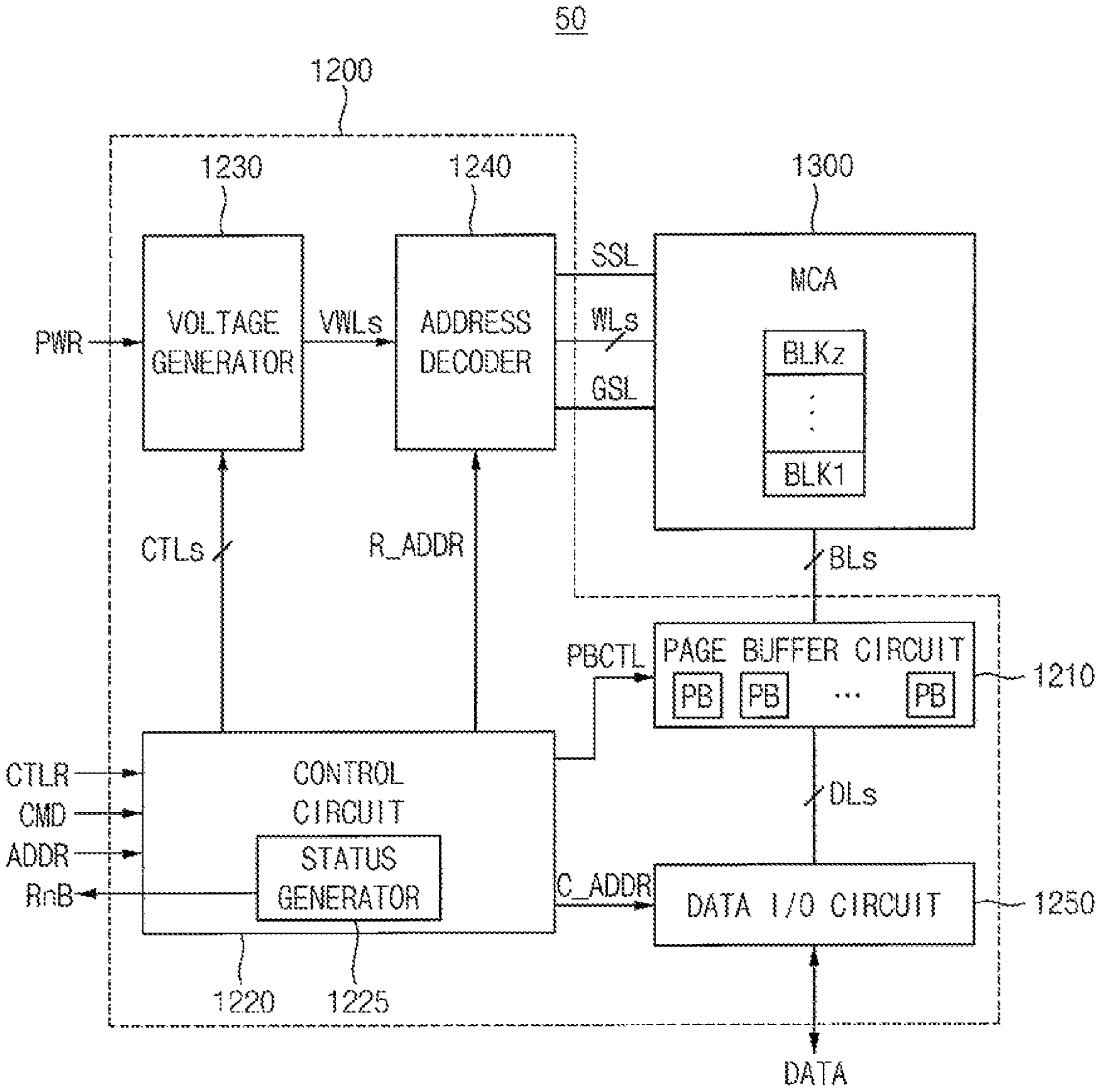
FIGS. 1 to 31 represent non-limiting, example embodiments as described herein.

Hereinafter, a direction parallel to a surface of a substrate surface is referred to as a first direction, and a direction parallel to the surface of the substrate and perpendicular to the first direction is referred to as a second direction. In addition, a direction perpendicular to the surface of the substrate is referred to as a vertical direction.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

FIG. 1 is a block diagram of a vertical semiconductor device in accordance with some example embodiments.

Referring to FIG. 1, the vertical semiconductor device 50 may include a memory cell array 1300 and a peripheral circuit 1200. The peripheral circuit 1200 may include a page buffer circuit 1210, a control circuit 1220, a voltage generator 1230, an address decoder 1240, and a data input/output circuit 1250. Although not shown, the peripheral circuit 1200 may further include input/output interfaces, column logic, a pre-decoder, a temperature sensor, or the like.

The memory cell array 1300 may be connected to the address decoder 1240 through a string select line SSL, a plurality of word lines WLs, and a ground select line GSL. Also, the memory cell array 1300 may be connected to the page buffer circuit 1210 via a plurality of bit lines BLs. The memory cell array 1300 may include a plurality of nonvolatile memory cells connected to a plurality of word lines WLs and a plurality of bit lines BLs.

In some example embodiments, the memory cell array 1300 having a three-dimensional structure (or a vertical structure) may be formed on a substrate. In this case, the memory cell array 1300 may include vertical memory cell strings including a plurality of memory cells stacked in the vertical direction.

The control circuit 1220 may receive a control signal CTRL, a command signal CMD, and an address signal ADDR from a memory controller, and the control circuit 1220 may control an erase loop, a program loop, and a read operation of the vertical semiconductor device based on the control signal CTRL, the command signal CMD, and the address signal ADDR.

For example, the control circuit 1220 may generate control signals CTLs for controlling a voltage generator 1230, a page buffer control signal PBCTL for controlling a page buffer circuit 1210 based on the command signal CMD, and a row address R_ADDR and a column address C_ADDR based on the address signal ADDR. The control circuit 1220 may provide the row address R_ADDR to the address decoder 1240, and the column address C_ADDR to the data input/output circuit 1250. The control circuit 1220 may include a status generator 1225 that generates a status signal (or ready/busy signal RnB) for indicating an operating state of the vertical semiconductor device 50.

The address decoder 1240 may be connected to the memory cell array 1300 via a string select line SSL, a plurality of word lines WLs, and a ground select line GSL. During a program operation or a read operation, the address decoder 1240 may determine one of the plurality of word lines WLs as a selected word line based on the row address R_ADDR provided from the control circuit 1220. Word lines WLs except for the selected word line may be determined as unselected word lines.

The voltage generator 1230 may generate word line voltages VWLs for operation of the vertical semiconductor device 50 by using a power PWR based on the control signals CTLs provided from the control circuit 1220. The word line voltages VWLs generated from the voltage generator 1230 may be applied to the plurality of word lines WLs through the address decoder 1240.

For example, in a program operation, the voltage generator 1230 may apply a program voltage to the selected word line, and may apply a program pass voltage to the unselected word lines. In a program verification operation, the voltage generator 1230 may apply a program verify voltage to the selected word line, and may apply a verify pass voltage to the unselected word lines. In a read operation, the voltage generator 1230 may apply a read voltage to the selected word line, and may apply a read pass voltage to the unselected word lines.

The string selection line SSL, the plurality of word lines WLs, and the ground selection line GSL may extend in the first direction parallel to a surface of the substrate. The string selection line SSL, the plurality of word lines WLs, and the ground selection line GSL may serve as gate electrodes, respectively, and the gate electrode may include a metal pattern. In order to form the metal pattern, a metal material may fill a gap between insulation patterns. In this case, as a vertical height of the gap is decreased, it may be difficult for the metal material to completely fill the gap. Therefore, voids may be generated in the metal pattern. The gate electrode may include a first metal pattern structure extending in the first direction and formed at a central portion in the second direction of the gap, and a second metal pattern formed on both sidewalls of the first metal pattern structure and filling the gap.

The page buffer circuit 1210 may be connected to the memory cell array 1300 via a plurality of bit lines BLs. The page buffer circuit 1210 may include a plurality of page buffers PB. The page buffer circuit 1210 may temporarily store data to be programmed in a selected page during the program operation, and may temporarily store data read from the selected page during the read operation.

The data input/output circuit 1250 may be connected to the page buffer circuit 1210 through a plurality of data lines DLs. In the program operation, the data input/output circuit 1250 may receive a program data DATA provided from the memory controller, and may supply the program data DATA to the page buffer circuit 1210 based on the column address C_ADDR provided from the control circuit 1220. In the read operation, the data input/output circuit 1250 may provide the read data DATA stored in the page buffer circuit 1210 to the memory controller based on the column address C_ADDR provided from the control circuit 1220.

Figure 2:
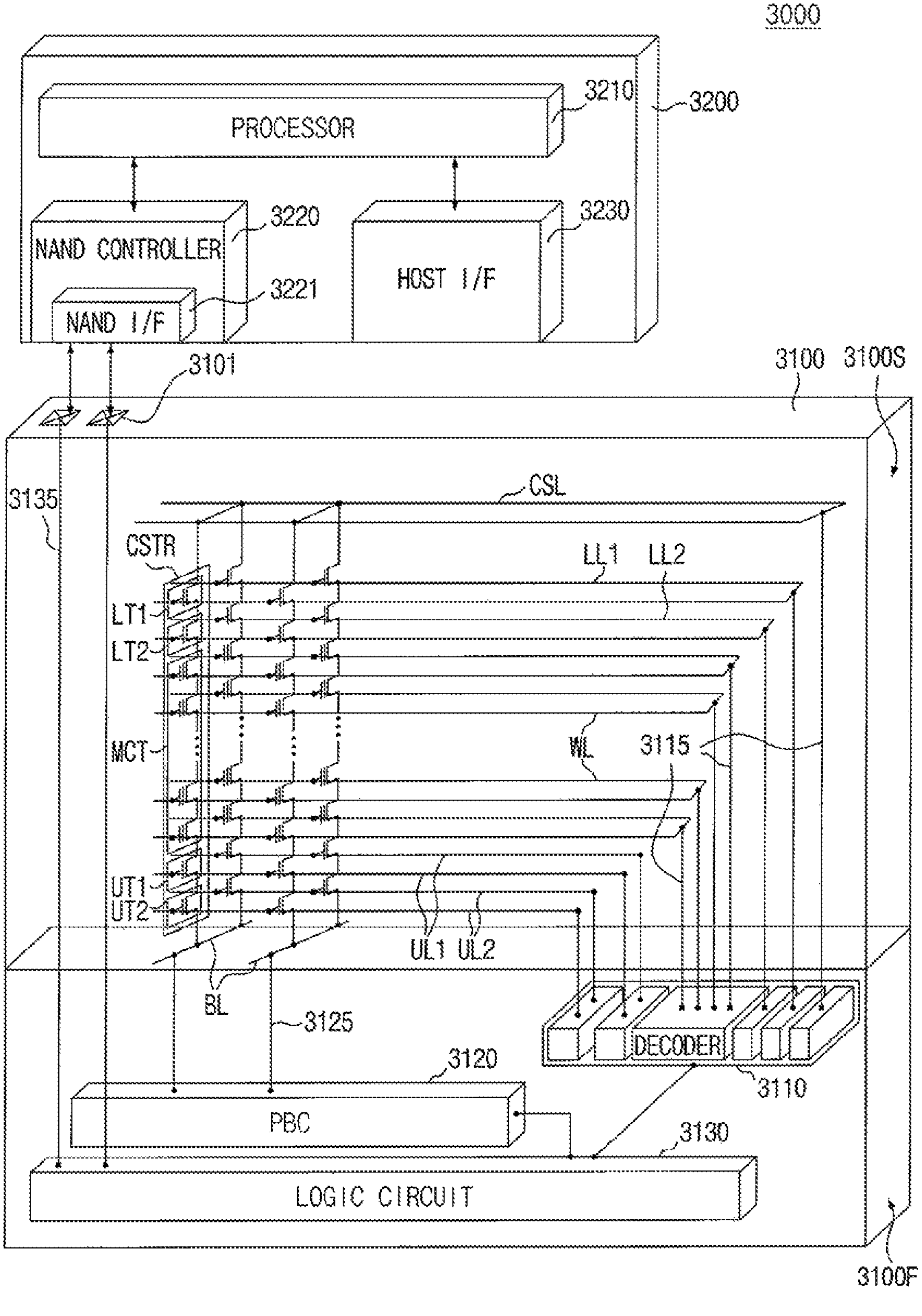

FIG. 2 is a block diagram illustrating an electronic system including a semiconductor device in accordance with some example embodiments.

Referring to FIG. 2, the electronic system 3000 may include a semiconductor device 3100 and a controller 3200 electrically connected to the semiconductor device 3100. The electronic system 3000 may be a storage device including one or a plurality of semiconductor devices 3100 or an electronic device including a storage device. For example, the electronic system 3000 may be a solid state drive (SSD) device, a universal serial bus (USB) device, a computing system, a medical device, or a communication device including one or a plurality of semiconductor devices 3100.

The semiconductor device 3100 may be a vertical semiconductor device. For example, the vertical semiconductor device may be described with reference to FIG. 1.

The vertical semiconductor device may include a first structure 3100F and a second structure 3100S on the first structure 3100F.

The first structure 3100F may be a peripheral circuit structure including a decoder circuit 3110, a page buffer circuit 3120, and a logic circuit 3130. The second structure 3100S may include bit lines BL, a common source line CSL, word lines WL, first and second gate upper lines UL1 and UL2, and first and second gate lower lines LL1 and LL2 and memory cell strings CSTR between the bit line BL and the common source line CSL.

In some example embodiments, the first structure 3100F may be formed on a substrate, and the second structure 3100S may be formed on the first structure 3100F.

In the second structure 3100S, each of the memory cell strings CSTR may include lower transistors LT1 and LT2 adjacent to the common source line CSL, and upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be varied in accordance with some example embodiments.

In some example embodiments, the upper transistors UT1 and UT2 may include string select transistors, and the lower transistors LT1 and LT2 may include ground select transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 that may be connected with each other in serial. The upper transistors UT1 and UT2 may include a string select transistor UT1 and an upper erase control transistor UT2 that may be connected with each other in serial. At least one of the lower erase control transistor LT1 and the upper erase control transistor UT1 may be used in an erase operation for erasing data stored in the memory cell transistors MCT through a gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 3110 through a first connection wiring 3115 extending from the first structure 3100F to the second structure 3100S. The bit lines BL may be electrically connected to the page buffer circuit 3120 through a second connection wire 3125 extending from the first structure 3100F to the second structure 3100S.

The first and second lower gate lines LL1 and LL2, the word lines WL, and the first and second upper gate lines UL1 and UL2 may serve as gate electrodes, respectively. The gate electrode may include a metal pattern. For forming the metal pattern, a metal material may fill the gap between the insulation patterns. In this case, as a vertical height of the gap is decreased, it may be difficult for the metal material to completely fill the gap. Therefore, voids may be generated in the metal pattern. The gate electrode may include the first metal pattern structure extending in the first direction and formed at the central portion in the second direction of the gap, and the second metal pattern formed on both sidewalls of the first metal pattern structure and filling the gap.

In the first structure 3100F, the decoder circuit 3110 and the page buffer circuit 3120 may control at least one selected memory cell transistor among the plurality of memory cell transistors MCT. The decoder circuit 3110 and the page buffer circuit 3120 may be controlled by the logic circuit 3130.

The semiconductor device 3100 may communicate with the controller 3200 through an input/output pad 3101 electrically connected to the logic circuit 3130. The input/output pad 3101 may be electrically connected to the logic circuit 3130 through an input/output connection line 3135 extending from the first structure 3100F to the second structure 3100S.

The controller 3200 may include a processor 3210, a NAND controller 3220, and a host interface 3230. In some example embodiments, the electronic system 3000 may include a plurality of semiconductor devices 3100, and in this case, the controller 3200 may control the plurality of semiconductor devices 3100.

The processor 3210 may control an operation of the electronic system 3000 including the controller 3200. The processor 3210 may be operated by a predetermined firmware, and may control NAND controller 3220 to the access the semiconductor device 3100. The NAND controller 3220 may include a NAND interface 3221 to be communicated with the semiconductor device 3100. Through the NAND interface 3221, a control command for controlling the semiconductor device 3100, data to be written in the memory cell transistors MCT of the semiconductor device 3100, and data to be read from the memory cell transistors MCT of the semiconductor device 3100 may be transferred by the NAND interface 3221. The host interface 3230 may be communicated to the electronic system 3000 and an external host. When a control command is received from the external host through the host interface 3230, the processor 3210 may control the semiconductor device 3100 in response to the control command.

Figure 3:
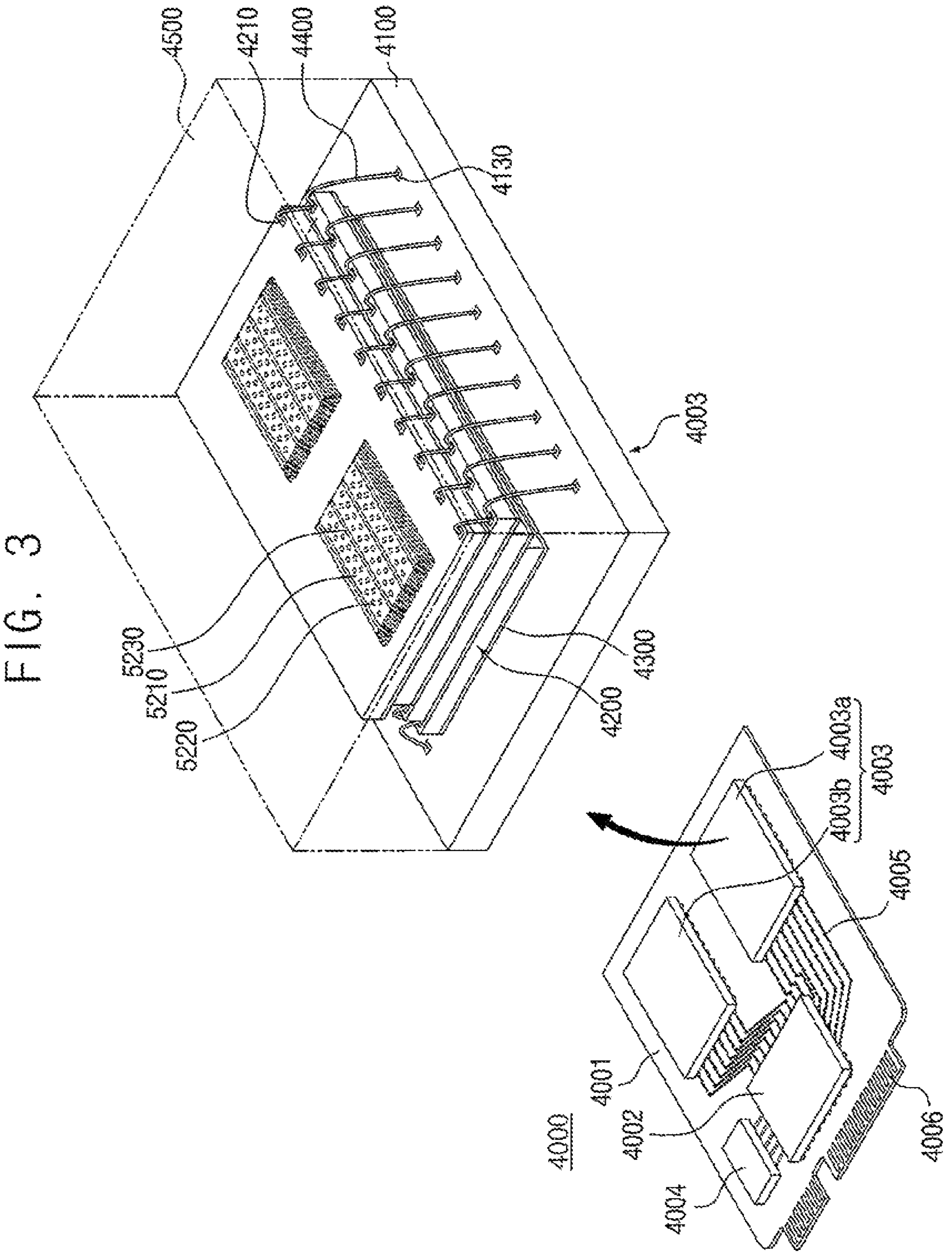

FIG. 3 is a schematic perspective view illustrating an electronic system including a semiconductor device in accordance with some example embodiments.

Referring to FIG. 3, the electronic system 4000 may include a main board 4001, a controller 4002 mounted on the main board 4001, one or more semiconductor packages 4003, and a dynamic random access memory (DRAM) device 4004. The semiconductor package 4003 and the DRAM device 4004 may be connected to the controller 4002 by wiring patterns 4005 on the main board 4001.

The main board 4001 may include a connector 4006 including a plurality of pins coupled to an external host. The number and arrangement of the plurality of pins in the connector 4006 may be changed depending on a communication interface between the electronic system 4000 and the external host. In some example embodiments, the electronic system 4000 may communicate with the external host according to one of interfaces such as USB, Peripheral Component Interconnect Express (PCI-Express), Serial Advanced Technology Attachment (SATA), and M-Phy for Universal Flash Storage (UFS), etc. In some example embodiments, the electronic system 4000 may be operated by power supplied from an external host through the connector 4006. The electronic system 4000 may further include a power management integrated circuit (PMIC) for distributing the power supplied from the external host to the controller 4002 and the semiconductor package 4003.

The controller 4002 may write data in the semiconductor package 4003 or read data from the semiconductor package 4003, and may enhance an operating speed of the electronic system 4000.

The DRAM device 4004 may be a buffer memory for reducing a speed difference between the semiconductor package 4003 for storing data and the external host. The DRAM device 4004 included in the electronic system 4000 may serve as a cache memory, and may provide a space for temporarily storing data in a control operation of the semiconductor package 4003. When the electronic system 4000 includes the DRAM device 4004, the controller 4002 may further include a DRAM controller for controlling the DRAM device 4004 in addition to the NAND controller for controlling the semiconductor package 4003.

The semiconductor package 4003 may include first and second semiconductor packages **4003*a* and 4003*b* spaced apart from each other. Each of the first and second semiconductor packages 4003*a* and 4003*b* may be a semiconductor package including a plurality of semiconductor chips 4200. Each of the first and second semiconductor packages 4003*a* and 4003*b* may include a package substrate 4100, the semiconductor chips 4200 on the package substrate 4100, and adhesive layers 4300 on lower surfaces of the semiconductor chips 4200, a connection structure 4400 for electrically connecting the semiconductor chips 4200 and the package substrate 4100, and a mold layer 4500 covering the semiconductor chips 4200 and the connection structure 4400 on the package substrate 4100**.

The package substrate 4100 may be a printed circuit board (PCB) including package upper pads 4130. Each of the semiconductor chips 4200 may include an input/output pad 4210. Each of the semiconductor chips 4200 may include gate electrode structures 5210, memory channel structures 5220 penetrating each of the gate electrode structures 5210, and insulation structures 5230 for separating the gate electrode structures 5210. Each of the semiconductor chips 4200 may include the vertical semiconductor device described with reference to FIG. 1 or 2.

In some example embodiments, the connection structure 4400 may be a bonding wire for electrically connecting the input/output pad 4210 and the package upper pads 4130.

A nonvolatile memory device or a storage device in accordance with some example embodiments may be mounted using various package types or package configurations.

Hereinafter, a vertical semiconductor device in accordance with some example embodiments and a method for manufacturing the same may be described. Particularly, the vertical semiconductor device including a gate structure having no void and a method for manufacturing the same may be described in more detail.

FIGS. 4, 5, 6, 7, 8, 9, 10, 11, 12, 13, 14, 15, 16, 17, 18, 19, 20, 21, 22, 23, 24, 25, and 26 are cross-sectional views illustrating a method of manufacturing a vertical semiconductor device in accordance with some example embodiments.

Particularly, FIGS. 4 to 6, 8, 10, 12 to 14, 22 and 26 are cross-sectional views. FIGS. 7, 11, 17, 19, 21, 24 and 25 are cross-sectional views of a portion of a gate structure cut in a horizontal direction. That is, FIGS. 7, 11, 17, 19, 21, 24 and 25 are cross-sectional views taken along line A-A' of FIG. 6. FIG. 9 is an enlarged cross-sectional view of a channel structure. FIGS. 15, 16, 18, 20 and 23 are enlarged cross-sectional views of portions of the gate structure.

Figure 4:
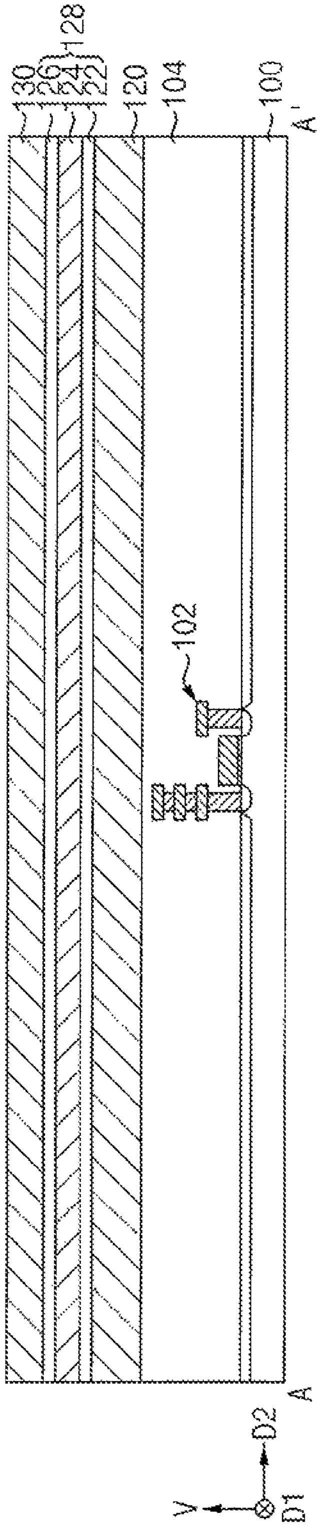

Referring to FIG. 4, a lower circuit pattern 102 may be formed on a semiconductor substrate 100, and a lower insulating interlayer 104 may be formed to cover the lower circuit pattern 102. The lower circuit pattern 102 may include, e.g., a transistor and wirings. The lower circuit pattern 102 may constitute peripheral circuits in a vertical semiconductor device.

A common electrode plate 120 (or, a common source plate) may be formed on the lower insulating interlayer 104. A first lower sacrificial layer structure 128 may be formed on the common electrode plate 120. A first support layer 130 may be formed on the first lower sacrificial layer structure 128.

The common electrode plate 120 may include, e.g., polysilicon doped with n-type impurities. Alternatively, the common electrode plate 120 may include a metal silicide layer and a polysilicon layer doped with n-type impurities sequentially stacked. The metal silicide layer may include, e.g., tungsten silicide.

The first lower sacrificial layer structure 128 may include first to third lower sacrificial layers 122, 124, and 126 sequentially stacked. Each of the first and third lower sacrificial layers 122 and 126 may include, e.g., an oxide such as silicon oxide, and the second lower sacrificial layer 124 may include, e.g., a nitride such as silicon nitride.

The first support layer 130 may include a material having an etch selectivity with respect to the first to third lower sacrificial layers 122, 124, and 126. The first support layer 130 may include, e.g., polysilicon doped with n-type impurities.

Figure 5:
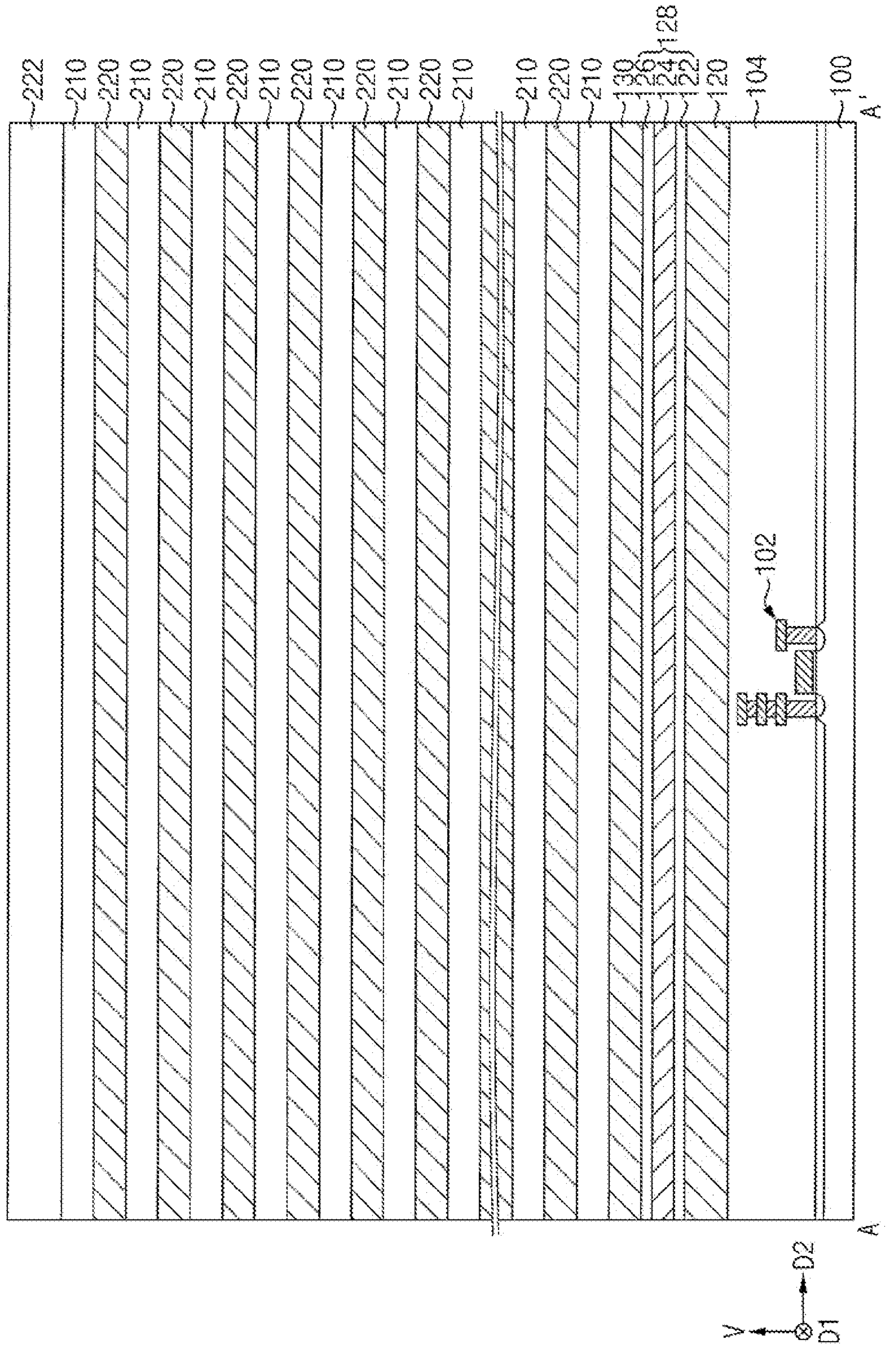

Referring to FIG. 5, a first insulation layer 210 and a first sacrificial layer 220 may be alternately and repeatedly stacked on the first lower sacrificial layer structure 128 in the vertical direction. A mold layer including the first insulation layers 210 and the first sacrificial layers 220 may be formed on the first lower sacrificial layer structure 128. The first insulation layer 210 may include, e.g., an oxide such as silicon oxide, and the first sacrificial layer 220 is a material having an etch selectivity with respect to the first insulation layer 210. The first sacrificial layer 220 may include, e.g., a nitride such as silicon nitride. An upper insulation layer 222 may be formed on an uppermost first insulation layer 210.

Figure 6:
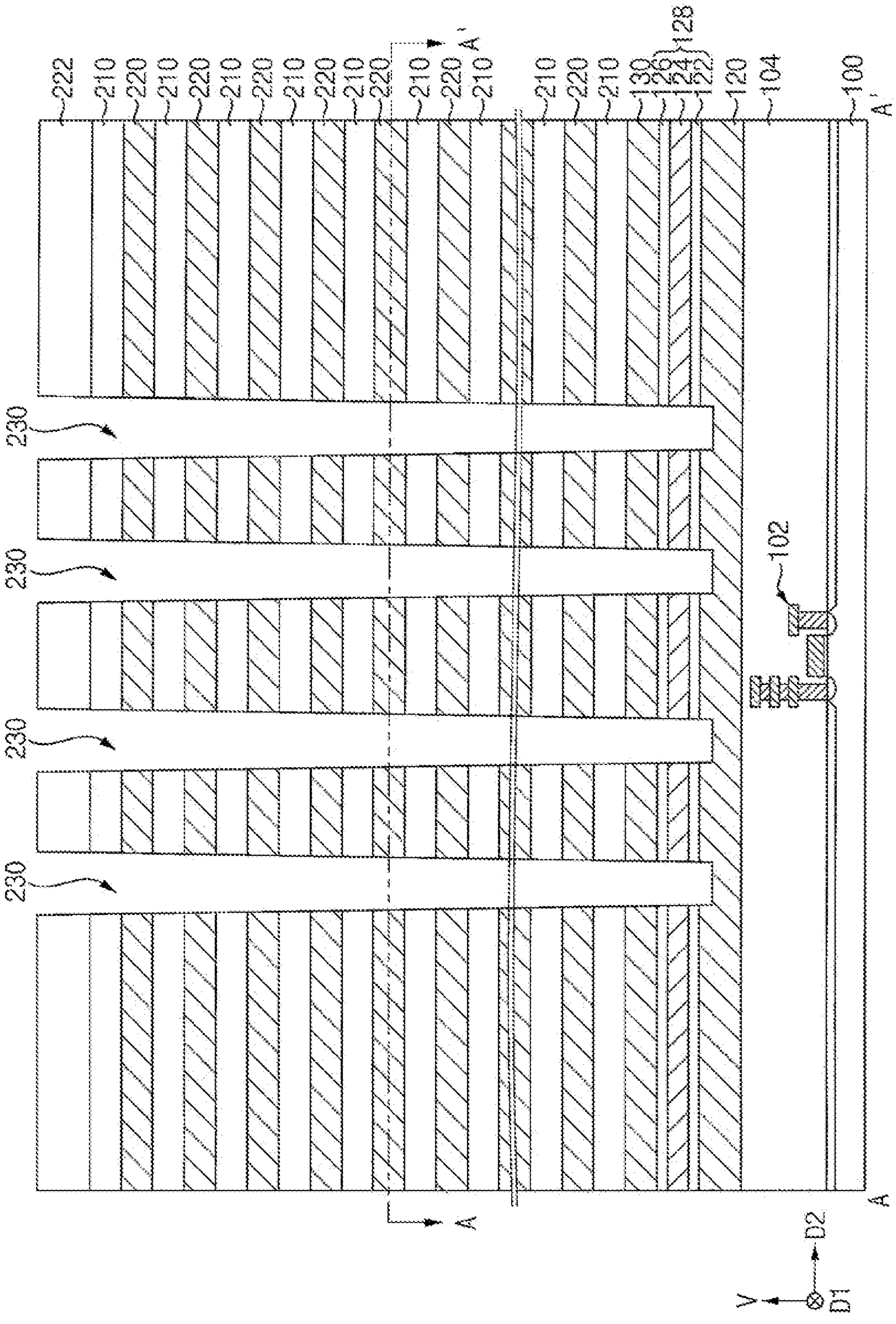
Figure 7:
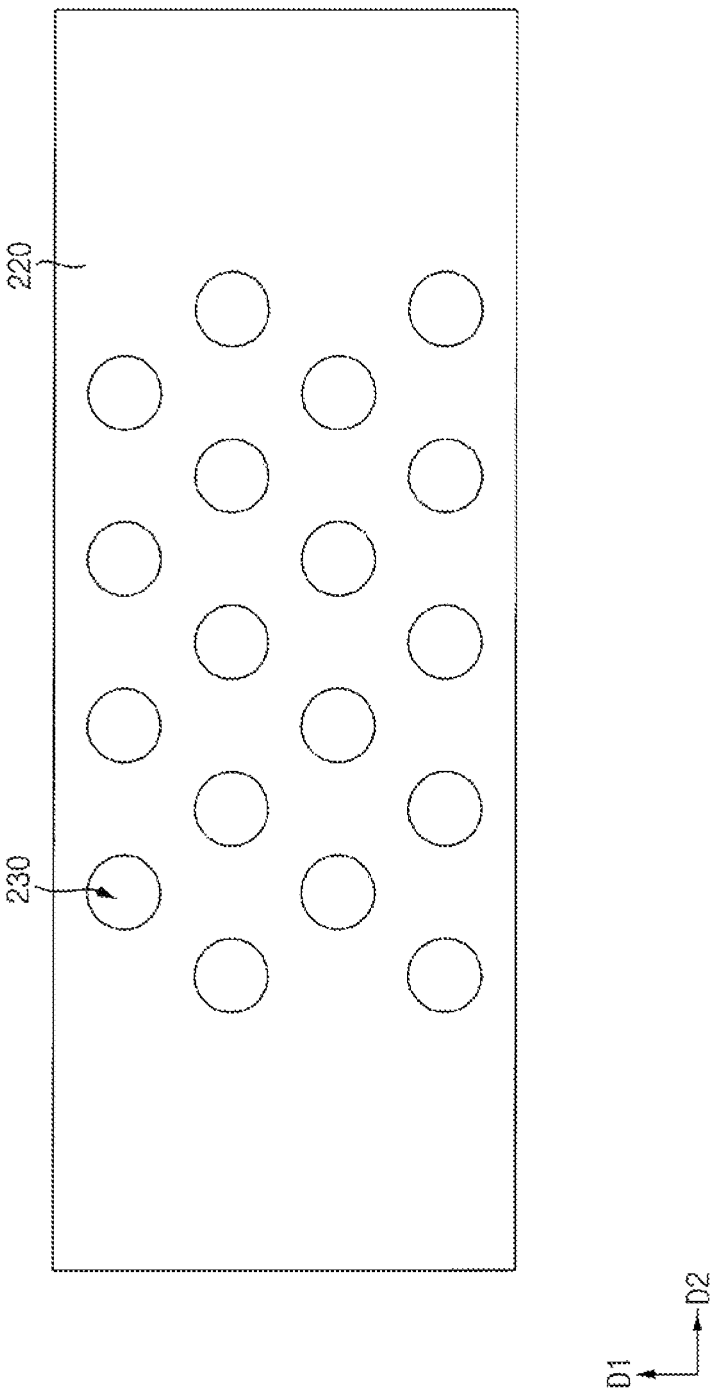

Referring to FIGS. 6 and 7, an etch mask pattern (not shown) may be formed on the upper insulation layer 222. The upper insulation layer 222, the first insulation layers 210, The first sacrificial layers 220, the first support layer 130 and the first lower sacrificial layer structure 128 may be etched using the etch mask pattern to form channel holes 230 exposing an upper surface of the common electrode plate 120. In the etching process, an upper portion of the common electrode plate 120 may also be partially etched. The channel holes 230 may be regularly arranged in unit of a cell block. A plurality of channel holes 230 may be arranged in the first and second directions D1 and D2, in one cell block.

In some example embodiments, in the one cell block, five channel holes 230 arranged in the second direction may be formed at odd-numbered columns, and four channel holes 230 arranged in the second direction may be formed at even-numbered columns. The channel holes 230 arranged in the odd-numbered columns and the channel holes 230 arranged in the even-numbered columns may be arranged in a zigzag fashion instead of parallel to each other in the first direction. In this case, it may be referred as a nine channel hole array disposed in the cell block.

In some example embodiments, in the one cell block, the two channel holes arranged in the second direction may be formed at odd-numbered columns and the two channel holes arranged in the second direction may be formed at even-numbered columns. The channel holes arranged in the odd-numbered columns and the channel holes arranged in the even-numbered columns may be arranged in a zigzag fashion instead of parallel to each other in the first direction. In this case, it may be referred as a four channel hole array disposed in the cell block.

Figure 8:
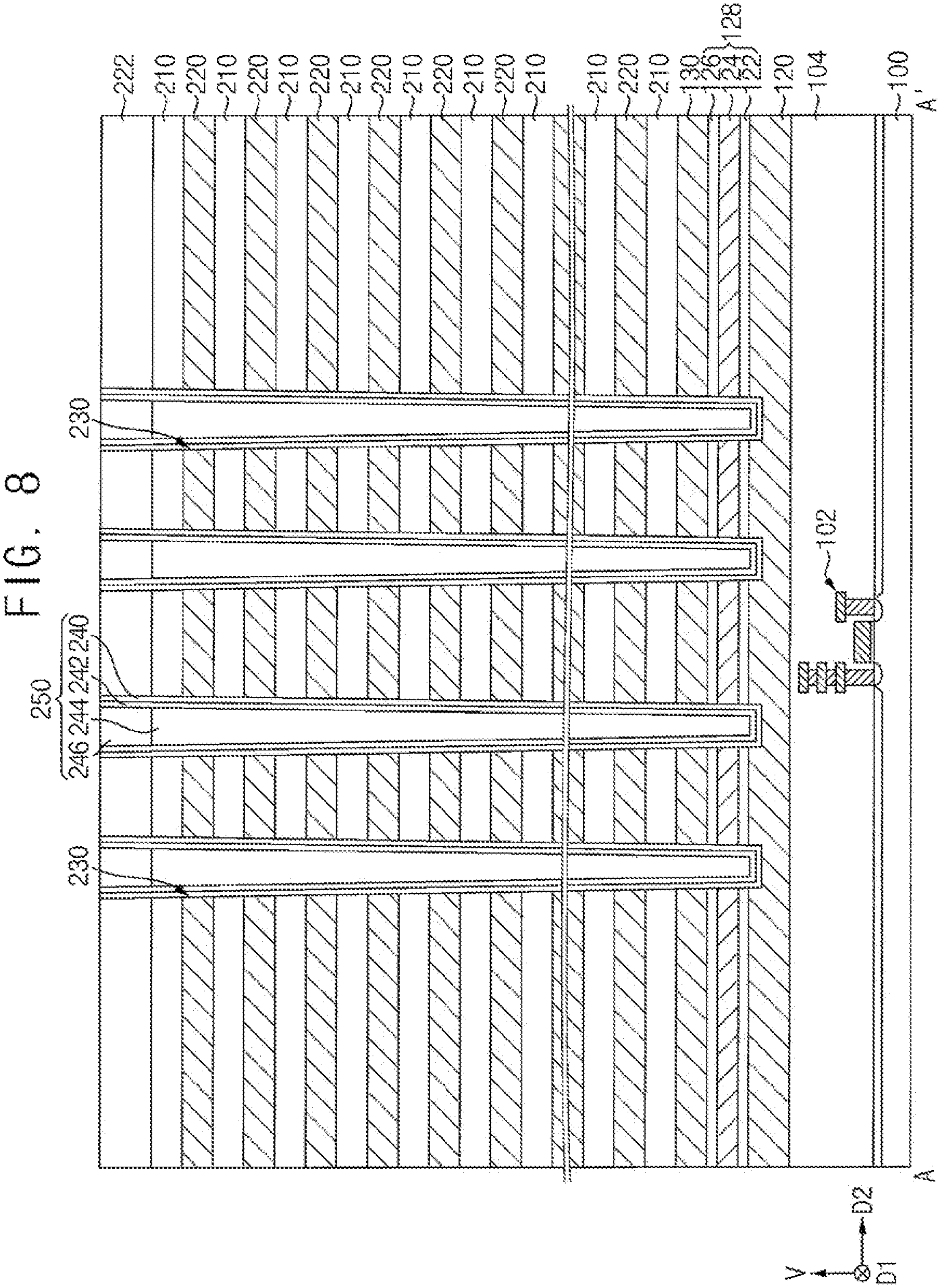
Figure 9:
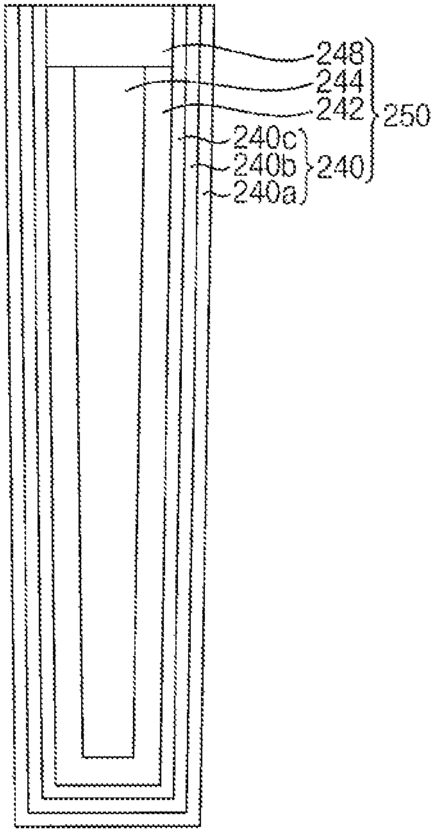

Referring to FIGS. 8 and 9, a channel structure 250 may be formed to fill the channel hole 230.

Particularly, a first blocking dielectric layer, a charge storage layer, and a tunnel insulation layer may be sequentially and conformally formed on a sidewall of the channel hole 230, the upper surface of the common electrode plate 120, and the upper insulation layer 222. A channel layer may be formed on the tunnel insulation layer, and a filling insulation layer may be formed on the channel layer to fill the channel hole 230.

The first blocking dielectric layer may include, e.g., silicon oxide, the charge storage layer may include, e.g., silicon nitride, and the tunnel insulation layer may include, e.g., silicon oxide. The first blocking dielectric layer, the charge storage layer, and the tunnel insulation layer may be formed by a chemical vapor deposition (CVD) process or an atomic layer deposition (ALD) process.

The channel layer may include, e.g., undoped polysilicon or polysilicon lightly doped with impurities, and the filling insulation layer may include, e.g., an oxide such as silicon oxide.

Thereafter, the filling insulation layer, the channel layer, the first blocking dielectric layer, the charge storage layer, and the tunnel insulation layer may be planarized until an upper surface of the upper insulation layer 222 may be exposed. Upper portions of the filling insulation layer and the channel layer may be etched to form a first recess. A capping pattern 246 may be formed in the first recess. The capping pattern 246 may include, e.g., undoped polysilicon or polysilicon doped with impurities.

Therefore, the channel structure 250 including a charge storage structure 240, a channel 242, a first filling insulation pattern 244, and the capping pattern 246 may be formed in the channel hole 230. As shown in FIG. 9, the charge storage structure 240 may include a first blocking dielectric layer pattern 240*a*, a charge storage pattern 240*b* and a tunnel insulation pattern 240*c* sequentially stacked.

Figure 10:
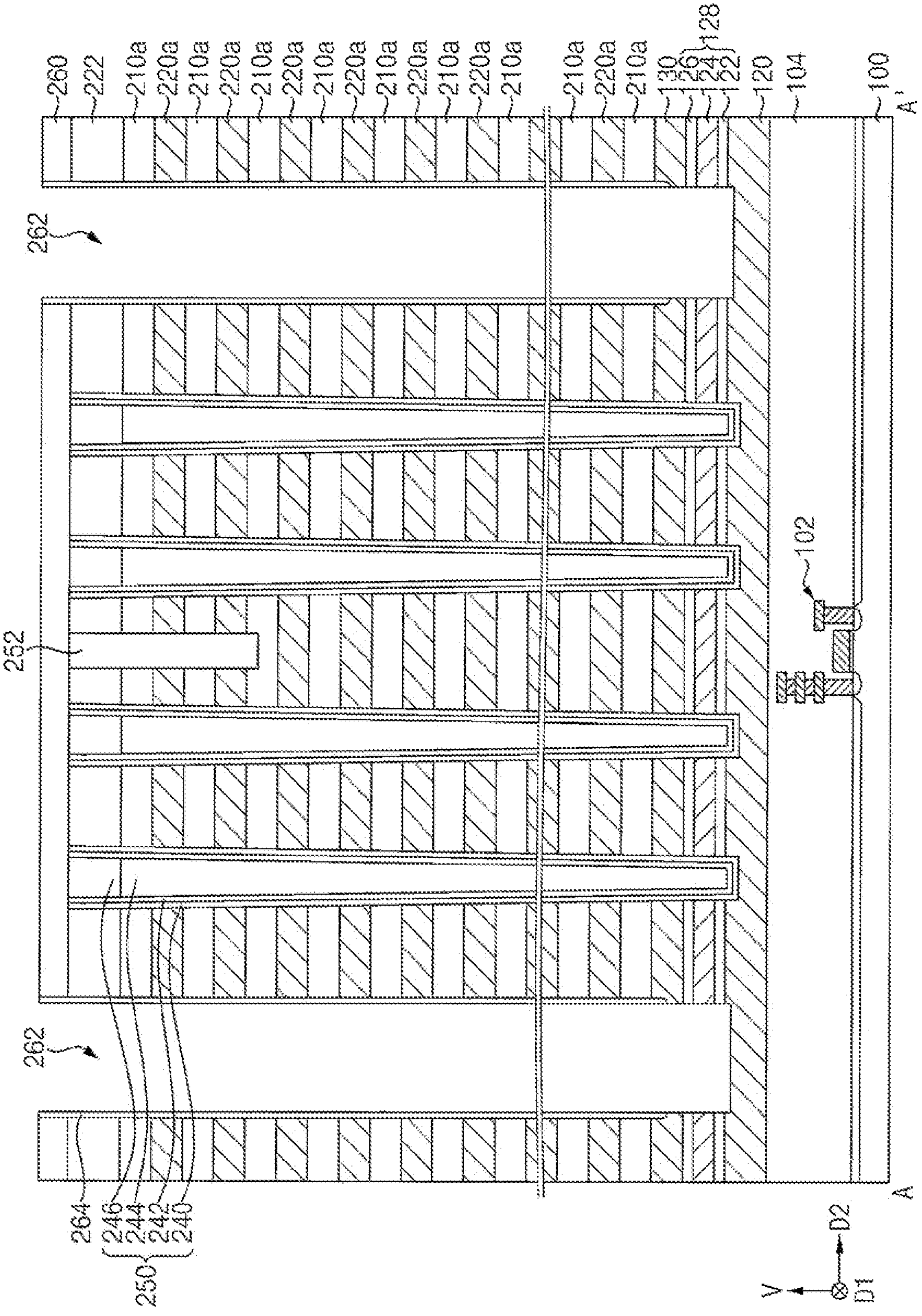
Figure 11:
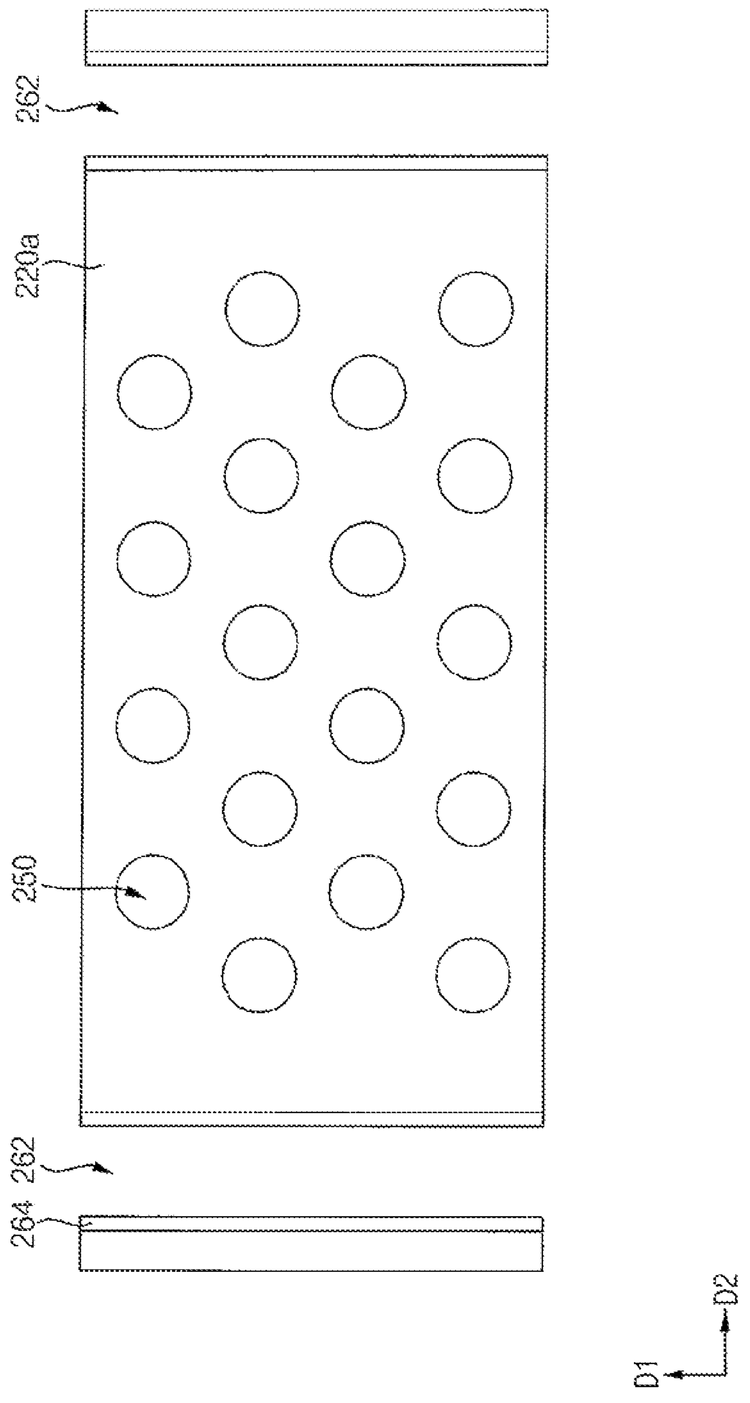

Referring to FIGS. 10 and 11, portions of the upper insulation layer 222, the first insulation layers 210 and the first sacrificial layers 220 may be etched to form an upper trench extending in the first direction D1. An insulation material may be formed to fill the upper trench, and a separation pattern 252 may be formed in the upper trench.

In some example embodiments, the separation pattern 252 may pass through upper two first sacrificial layers 220 and upper two first insulation layers 210. Therefore, the upper two first sacrificial layers 220 may be separated from each other. The separation pattern 252 may serve as a cutting region of a string selection line.

A first insulating interlayer 260 may be formed on the upper insulation layer 222, the separation pattern 252, and the channel structure 250.

The first insulating interlayer 260, the upper insulation layer 222, the first insulation layers 210, and the first sacrificial layers 220 may be etched to form a preliminary trench exposing the first support layer 130. In the etching process, an upper portion of the first support layer 130 may be partially etched.

After forming a first spacer layer on the preliminary trench and the first insulating interlayer 260, an anisotropic etching process may be performed to form a first spacer 264 on a sidewall of the preliminary trench. In some example embodiments, the first spacer 264 may include, e.g., polysilicon that is not doped with impurities.

Thereafter, exposed portions of the first support layer 130 and the first lower sacrificial layer structure 128 may be removed to form a trench 262 exposing the upper surface of the common electrode plate 120. In the removal process, the upper portion of the common electrode plate 120 may be partially etched.

The trench 262 may extend in the first direction. A plurality of trenches 262 may be arranged in the second direction. A cell block region may be divided by the trenches 262.

As the trench 262 is formed, the first insulation layers 210 and the first sacrificial layers 220 may be separated to form first insulation patterns 210*a* and the first sacrificial patterns 220*a*, respectively. Thus, a mold structure including the first insulation patterns 210*a* and first sacrificial patterns 220*a* and extending in the first direction may be formed on the common electrode plate 12-. The trenches 262 may be disposed at both sidewalls of the mold structure.

Figure 12:
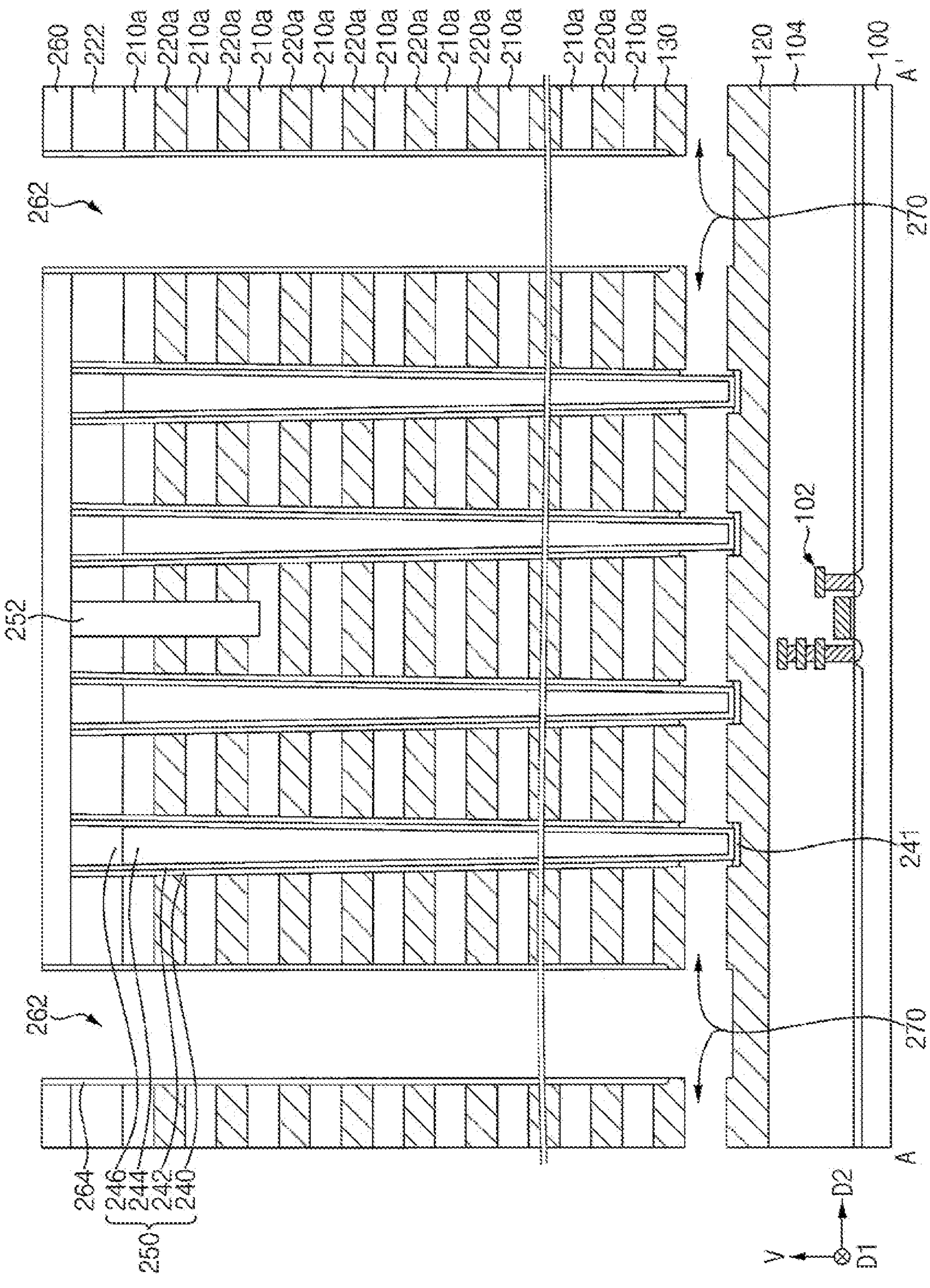

Referring to FIG. 12, the first lower sacrificial layer structure 128 exposed by the trench 262 may be removed to form a first gap 270. The removal process may be, e.g., a wet etching process.

A lower sidewall of the charge storage structure 240 may be exposed by the first gap 270. The exposed lower sidewall of the charge storage structure 240 may be removed together during the wet etching process so that a lower outer wall of the channel 242 may be exposed. Thus, the charge storage structure 240 may be separated to have an upper portion and a lower portion. The upper portion may pass through the first insulation patterns 210*a* and the first sacrificial patterns 220*a* to cover most outer walls of the channel 242. The lower portion 241 may cover a lower portion and a bottom of the channel, and may be formed on the common electrode plate 120.

Figure 13:
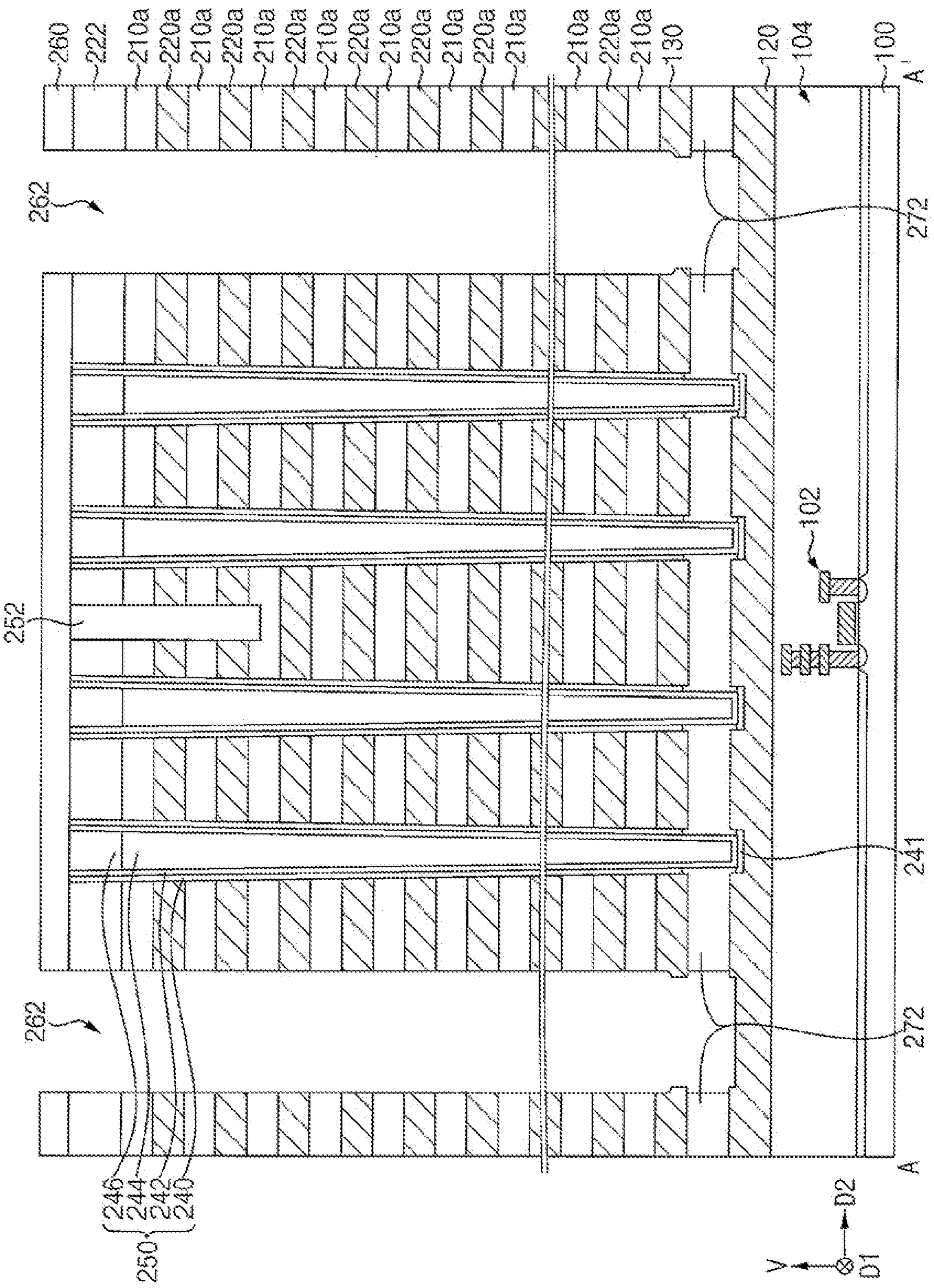

Referring to FIG. 13, the first spacer 264 may be removed, and a channel connection layer may be formed on a surface of the trench 262 and in the first gap 270. The channel connection layer may completely fill the first gap 270.

The channel connection layer formed on the surface of the trench 262 may be selectively etched to form a channel connection pattern 272 filling the first gap 270.

As the channel connection pattern 272 may be formed, adjacent channels 242 may be electrically connected to each other. Also, the channels 242 may be electrically connected to the common electrode plate 120 by the channel connection pattern 272. The channel connection pattern 272 may include, e.g., polysilicon doped with n-type impurities or undoped polysilicon.

Figure 14:
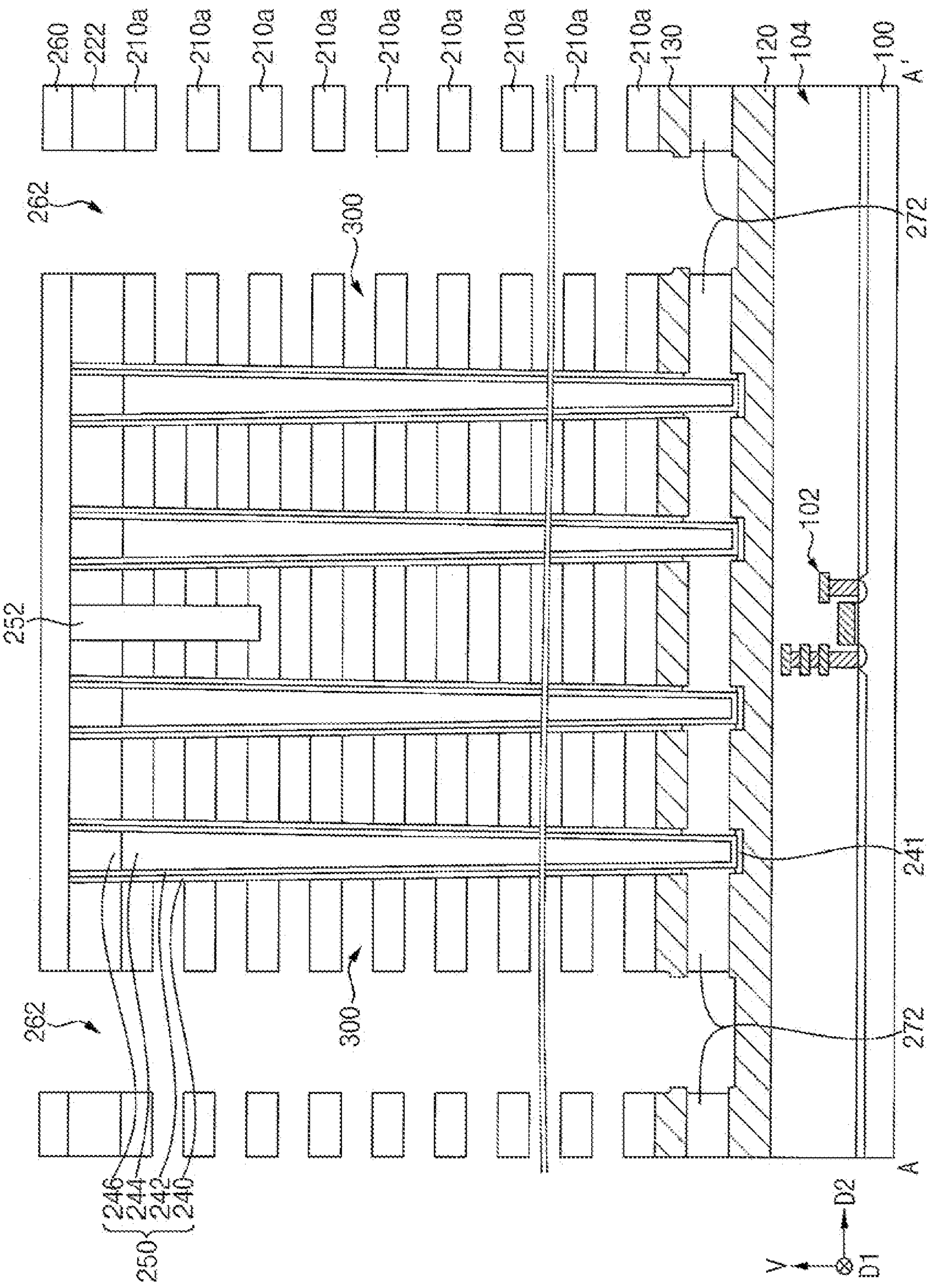
Figure 15:
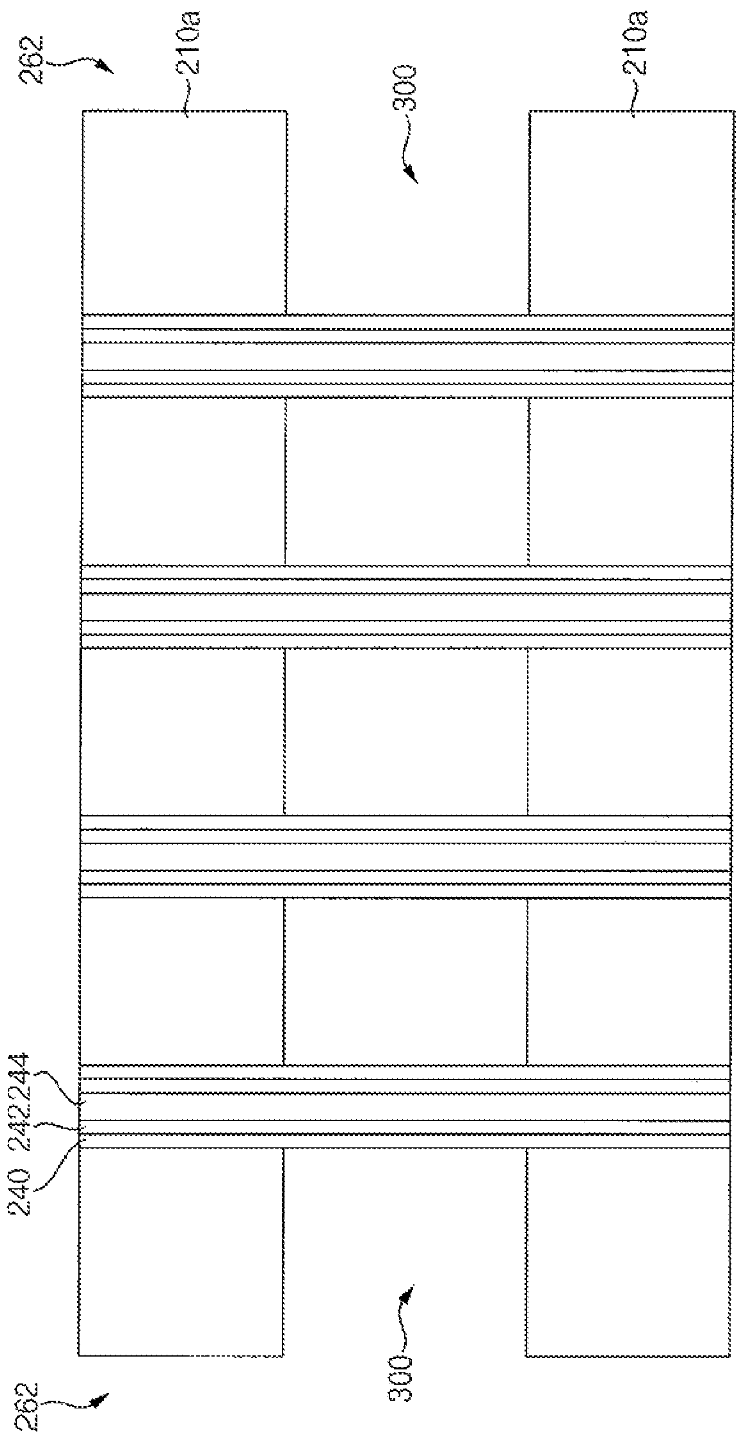

Referring to FIGS. 14 and 15, the first sacrificial patterns 220*a* exposed by the trench 262 may be etched to form a second gap 300 at least partially defined between the first insulation patterns 210*a* of each level. A portion of the outer wall of the channel structure 250 may be exposed by the second gap 300.

In some example embodiments, the first sacrificial patterns 220*a* may be removed by a wet etching process using an etchant including phosphoric acid (H3PO4) or sulfuric acid (H2SO4).

The second gap 300 may correspond to a space at least partially defined between opposing surfaces of the first insulation patterns 210*a* spaced apart in the vertical direction, and may be positioned between the trenches 262 at both sides of the mold structure. Each of the channel structures 250 may vertically pass through the first insulation patterns 210*a* and the spaces (i.e., second gaps), and the channel structures 250 may be regularly disposed. An upper surface and a lower surface of the second gap 300 may defined by the first insulation patterns 210*a* spaced apart in the vertical direction, respectively. A sidewall of the second gap 300 may be defined by the outer wall of the channel structure 250.

In the cross-sectional view, a portion of the second gap 300 close to the trenches 262 (i.e., a side portion of the second gap 300) may be referred to as an inlet portion of the second gap 300. A portion in the second gap 300 far from the trenches 262 of both sides of the second gap 300 may be referred to as a central portion in the second direction of the second gap 300. The central portion of the second gap 300, shown as central portion CP in FIG. 23, may be positioned at a central portion in the second direction of the mold structure so that a pattern located in the central portion CP is spaced apart from opposite side boundaries of the second gap 300 in the second direction D2. Remaining portions of the second gap 300 excluding the central portion may be referred to as remainder portions RP or side portions of the second gap 300.

Figure 16:
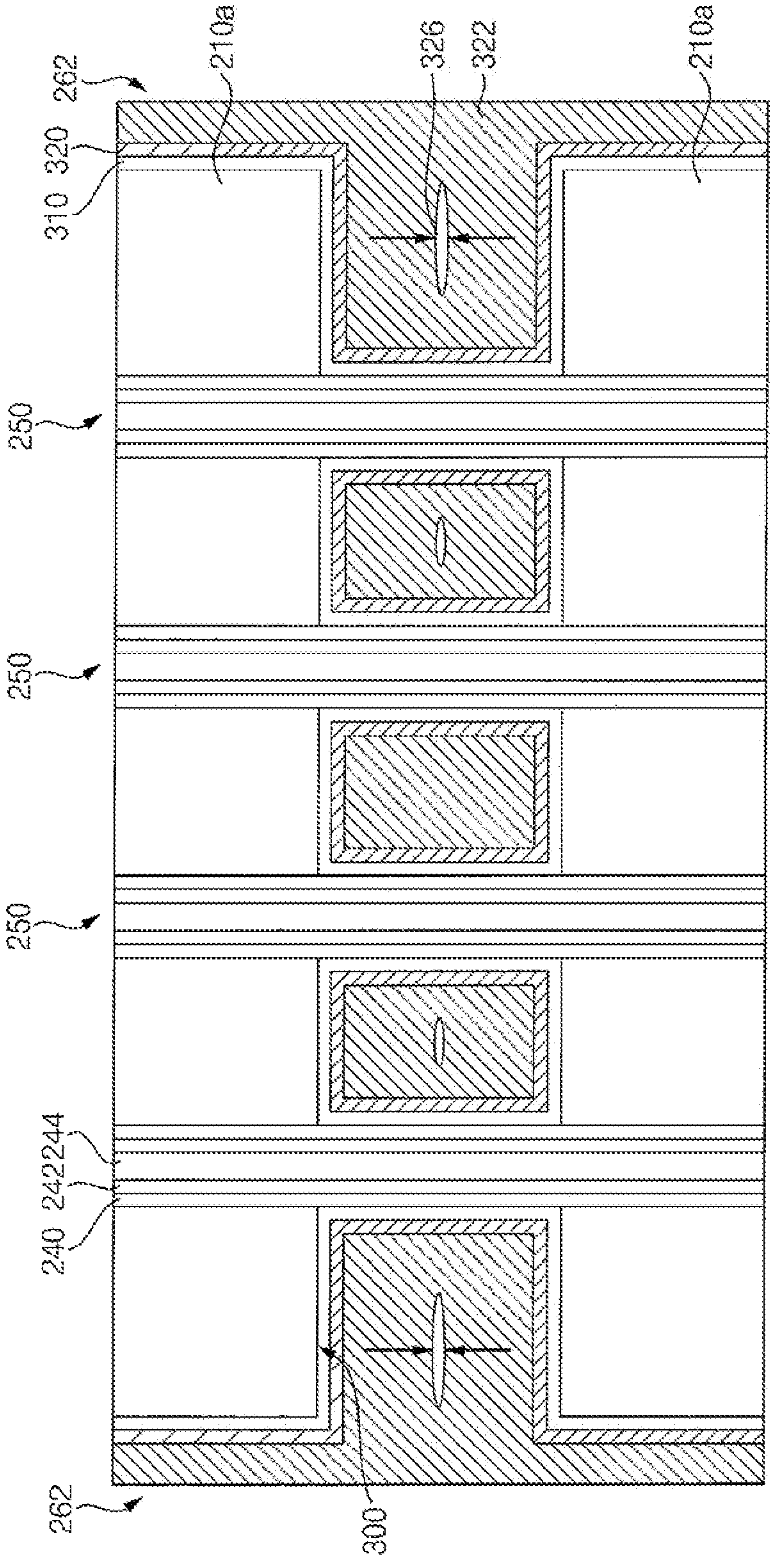
Figure 17:
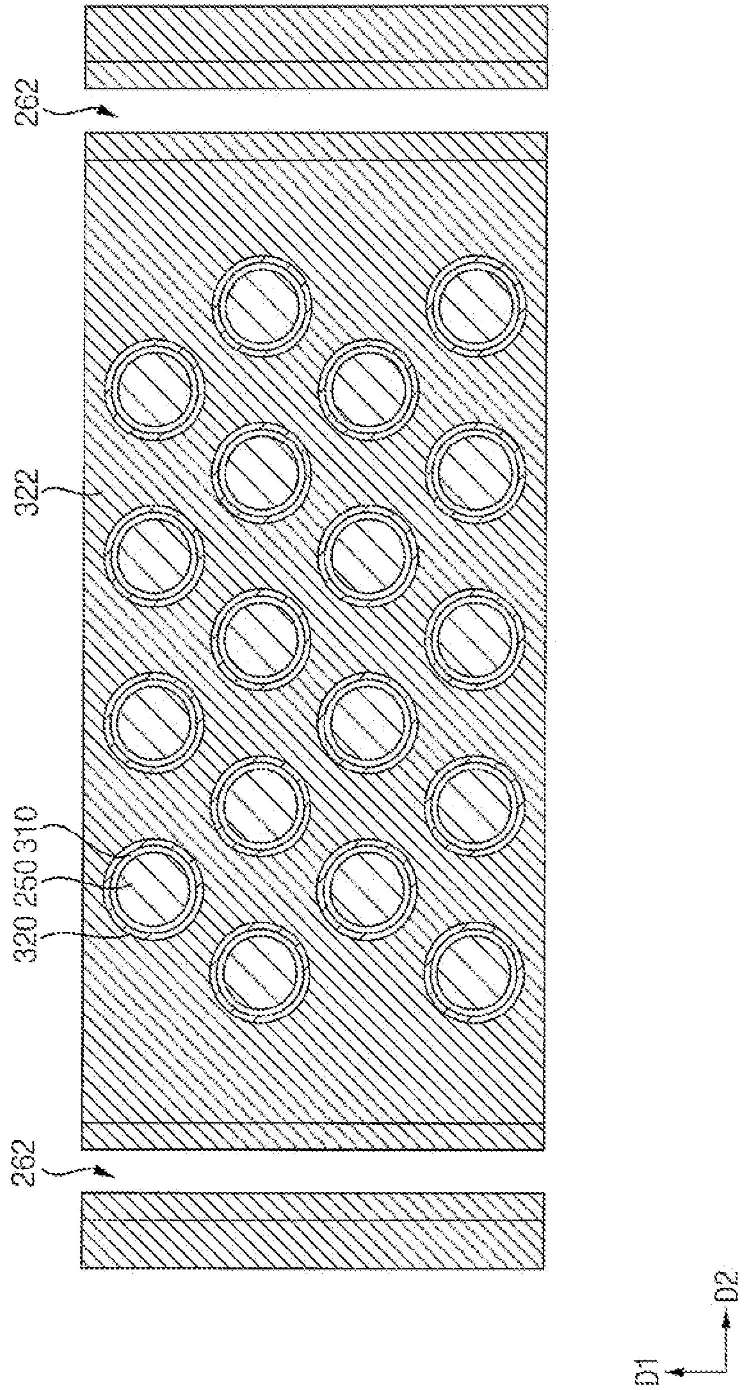

Referring to FIGS. 16 and 17, a second blocking dielectric layer 310 may be conformally formed on the surface of the trench 262, the surface of the first insulation patterns 210*a* in the second gap 300, and the outer wall of the channel structure 250 in the second gap 300. The second blocking dielectric layer 310 may include an oxide. For example, the second blocking dielectric layer 310 may include a metal oxide such as aluminum oxide, hafnium oxide, zirconium oxide, or the like.

A barrier metal layer 320 may be conformally formed on the second blocking dielectric layer 310. The barrier metal layer 320 may include, e.g., titanium nitride, tantalum nitride, titanium, tantalum, tungsten nitride, tantalum silicon nitride, titanium, or titanium nitride.

A first metal layer 322 may be formed on the barrier metal layer 320 to fill the second gap 300. The first metal layer 322 may include, e.g., tungsten, molybdenum, cobalt, or ruthenium.

Particularly, the first metal layer 322 may be formed by a chemical vapor deposition process or an atomic layer deposition process. The first metal layer 322 may be deposited along a profile of a lower layer (i.e., the barrier metal layer 320) to have a predetermined thickness. Therefore, the first metal layer 322 may be formed along sidewalls and bottom of the trench 262 and along a profile of the second gap 300. A metal material may be deposited to have a predetermined thickness from a surface of the barrier metal layer 320 formed on the bottom of the upper first insulation pattern 210*a* in the second gap 300, the outer wall of the channel structure 250, and the upper surface of the lower first insulation pattern 210*a* in the second gap 300, and thus the first metal layer 322 may be formed.

In this case, the metal material may be deposited downward from the surface of the barrier metal layer 320 on the bottom of the upper first insulation pattern 210*a* in the second gap 300, and the metal material may be deposited upwardly from a surface of the barrier metal layer 320 on the upper surface of the lower first insulation pattern 210*a* in the second gap 300. The metal material may be deposited laterally from a surface of the barrier metal layer 320 on the outer wall of the channel structure 250.

When the metal material deposited downward from the surface of the barrier metal layer 320 on the bottom of the upper first insulation pattern 210*a* in the second gap 300 and the metal material deposited upward from the surface of the barrier metal layer 320 on the upper surface of the lower first insulation pattern 210*a* in the second gap 300 contact to each other, the first metal layer 322 may fill the second gap 300. When the first metal layer 322 is formed to have a thickness of about ½ or more of a vertical height of the second gap 300 in which the barrier metal layer 320 is formed, the first metal layer 322 may fill the second gap 300.

The vertical height of the second gap 300 may be very small. In some example embodiments, the vertical height of the second gap 300 may be in a range of about 10 nm to about 100 nm. Therefore, in a deposition process of the first metal layer, deposition source gases may not be sufficiently flow into the second gap 300. Before the first metal layer 322 having a sufficient thickness for filling the second gap 300 is formed, the first metal layer 322 may be deposited to have a relatively thick thickness at the inlet portion of the second gap 300 in communication with the trench 262. In this case, the inlet portion of the second gap 300 may be closed by the first metal layer 322. The deposition source gas may no longer flow into the second gap 300 with closed inlet, so that the first metal layer 322 may not be formed to fill the second gap 300. Thus, a void 326 may be formed in the second gap 300. The void 326 may have a slit shape extending in a direction parallel to the surface of the semiconductor substrate 100. For example, the void 326 may be formed in a central portion in the vertical direction of the second gap 300.

Figure 18:
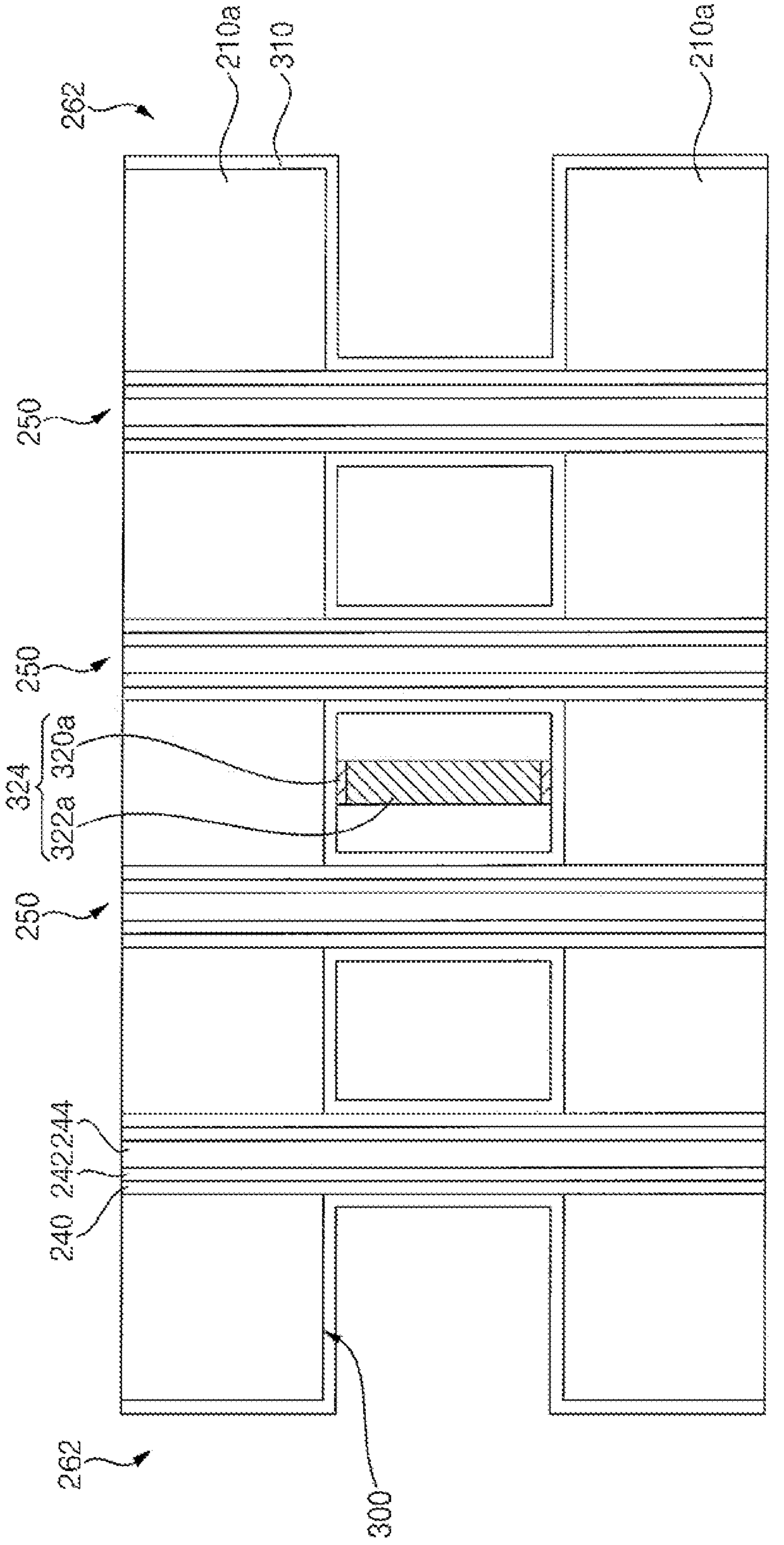
Figure 19:
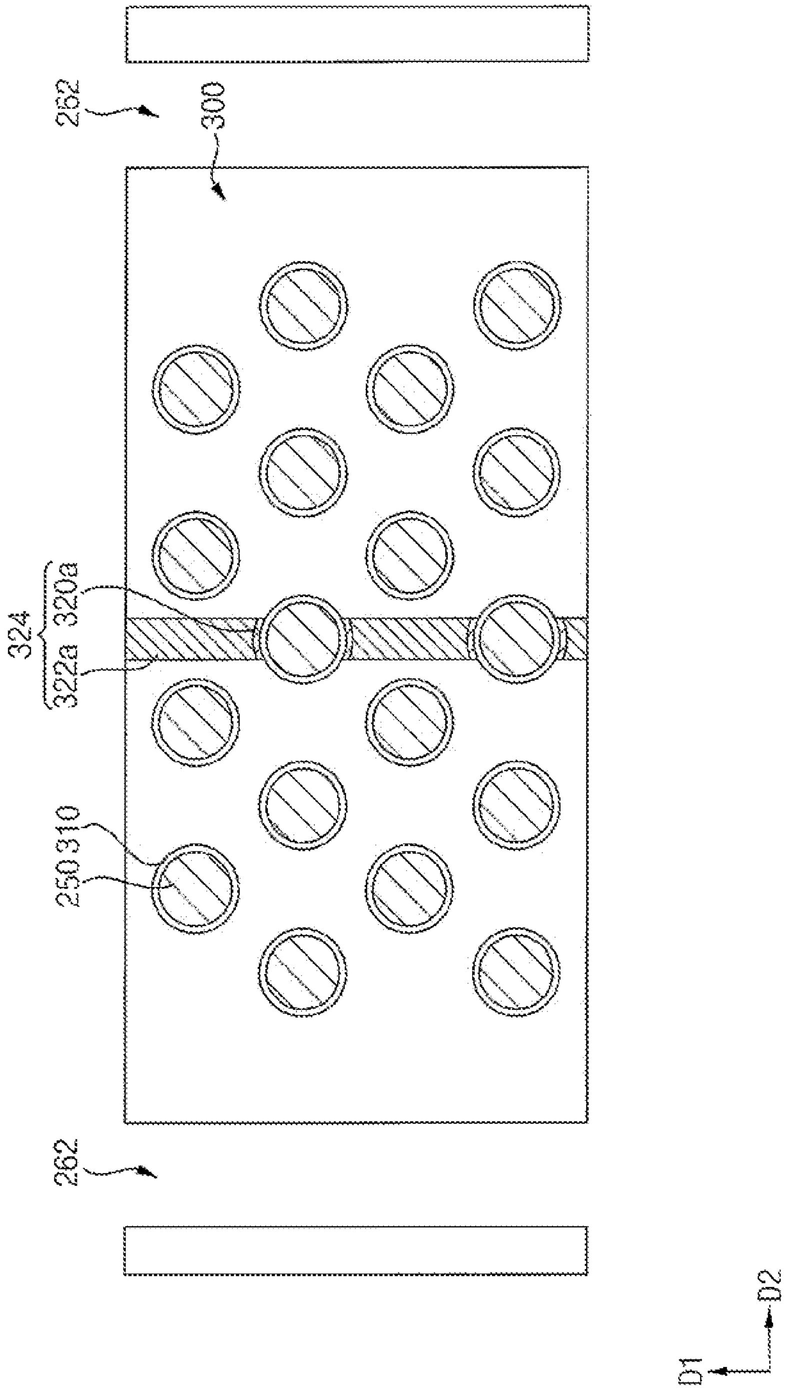

Referring to FIGS. 18 and 19, the first metal layer 322 and the barrier metal layer 320 may be partially etched to form a first metal pattern 322*a* and a barrier metal pattern 320*a*. The etching process may include an isotropic etching process. For example, the etching process may include wet etching or isotropic dry etching.

Particularly, in the etching process, the first metal layer 322 and the barrier metal layer 320 formed on the surface of the trench 262 may be completely removed to expose the second blocking dielectric layer 310 on the surface of the trench 262. Further, the first metal layer 322 and the barrier metal layer 320 formed at the inlet of the second gap 300 may be removed to form a first metal pattern structure 324 including the first metal pattern 322*a* and the barrier metal pattern 320*a* at an inner portion of the second gap 300. The first metal pattern structure 324 may partially fill the second gap 300.

After the etching process, only the first metal layer 322 and the barrier metal layer 320 positioned at the central portion in the second direction of the second gap 300 may remain. Thus, as shown in at least FIGS. 18, 20, and 23, the first metal pattern structure 324 may fill the central portion CP in the second direction of the second gap 300, and may extend in the first direction. The first metal pattern structure 324 may surround at least a portion of the outer wall of the channel structure 250 positioned at the central portion in the second direction of the second gap 300. Meanwhile, the outer wall of the channel structures 250 adjacent the inlet of the second gap 300 may be exposed.

In the etching process, a portion of the first metal layer including the void may be mostly removed, so that the first metal pattern structure 324 may not include the void.

As an amount of first metal layer 322 etched may increase, the portion of the first metal layer 322 including voids may be more removed. However, if a length in the second direction of the first metal layer pattern is less than about 2 nm, deposition source gases for forming the second metal layer may be diffused into the first metal layer pattern, during forming the second metal layer. Thus, defects of first metal pattern may be generated. Further, when a variation in the deposition process occurs, the residual amount of the first metal pattern may be greatly decreased. Therefore, in some example embodiments, the length in the second direction of the first metal pattern 322*a* may be greater than about 2 nm.

Meanwhile, the first metal pattern 322*a* may be formed to have a length in the second direction less than about 40% of the length in the second direction of the second gap 300 (i.e., a length between both trenches), for example about 0.01% to about 40%, about 1% to about 40%, about 5% to about 40%, etc. Within this range, voids may be absent from the first metal pattern 322*a*, thereby enabling reduced likelihood of defects in the resultant vertical semiconductor device including the first metal pattern 322*a* and thus improving reliability of the vertical semiconductor device. When the length in the second direction of the first metal pattern 322*a* is greater than about 40% of the length in the second direction of the second gap 300, voids may remain in the first metal pattern 322*a*. Therefore, the length in the second direction of the first metal pattern 322*a* may be greater than about 2 nm, and may be less than 40% of the length in the second direction of the second gap 300.

The second blocking dielectric layer 310 may be exposed on upper and lower surfaces of the second gap 300 in which the first metal pattern structure 324 is formed.

The barrier metal pattern 320*a* in the first metal pattern structure 324 may directly contact the second blocking dielectric layer 310, and may be formed along an inner surface of the second gap 300. The first metal pattern 322*a* may be formed on the barrier metal pattern 320*a*. The barrier metal pattern 320*a* may surround at least a partial surface of the first metal pattern 322*a*. For example, as shown in FIG. 18, the barrier metal pattern 320*a* (also referred to herein as a first barrier metal pattern) may surround opposite vertical surfaces of the first metal pattern 322*a* in the vertical direction and thus may be understood to surround a portion of a surface of the first metal pattern 322*a*, although in some example embodiments the barrier metal pattern 320*a* may surround additional portions of the surface of the first metal pattern 322*a*.

Both sidewalls of the first metal pattern structure 324 and the second blocking dielectric layer 310 may be exposed by the second gap 300 in which the first metal pattern structure 324 is formed.

Figure 20:
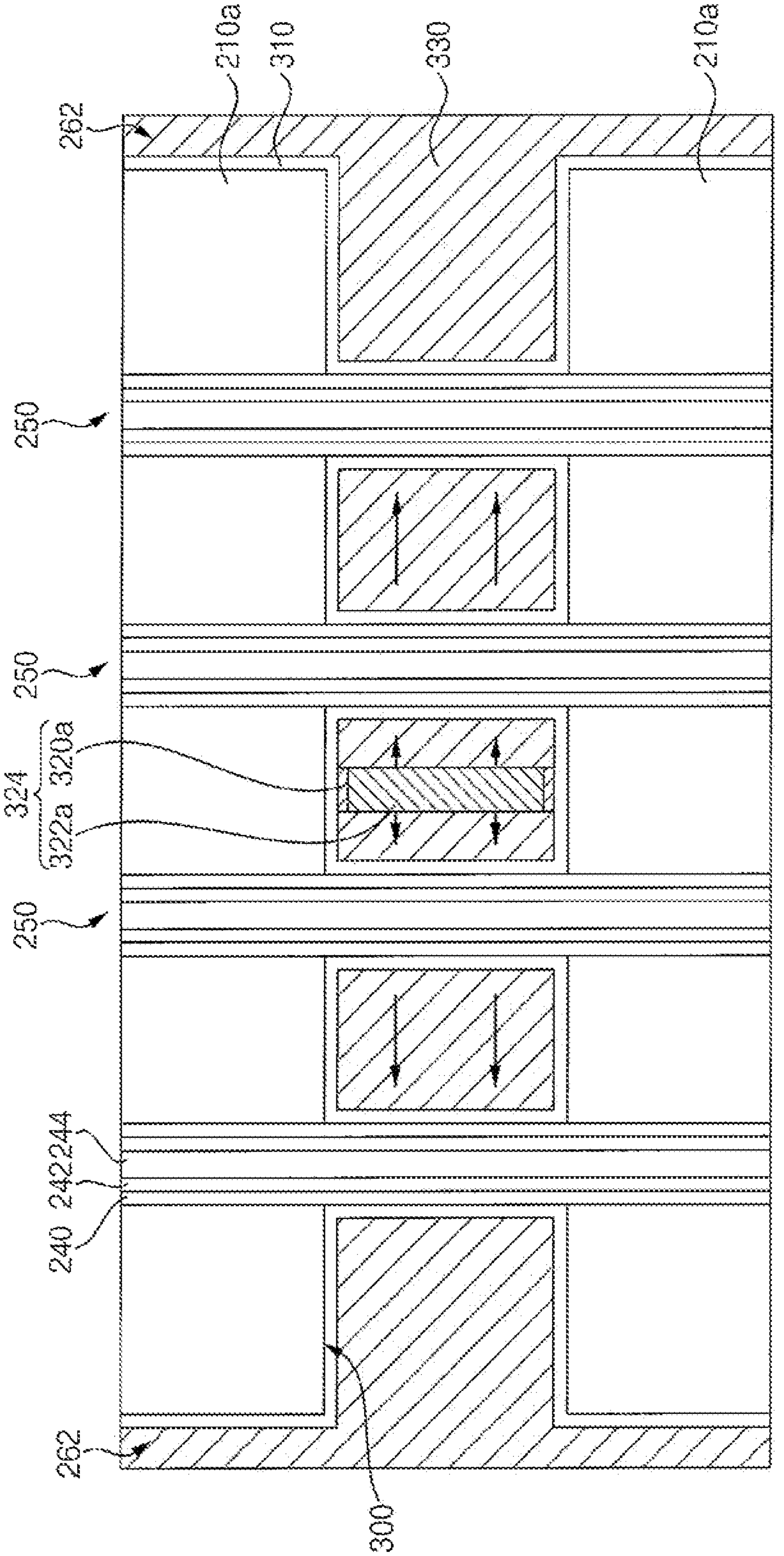
Figure 21:
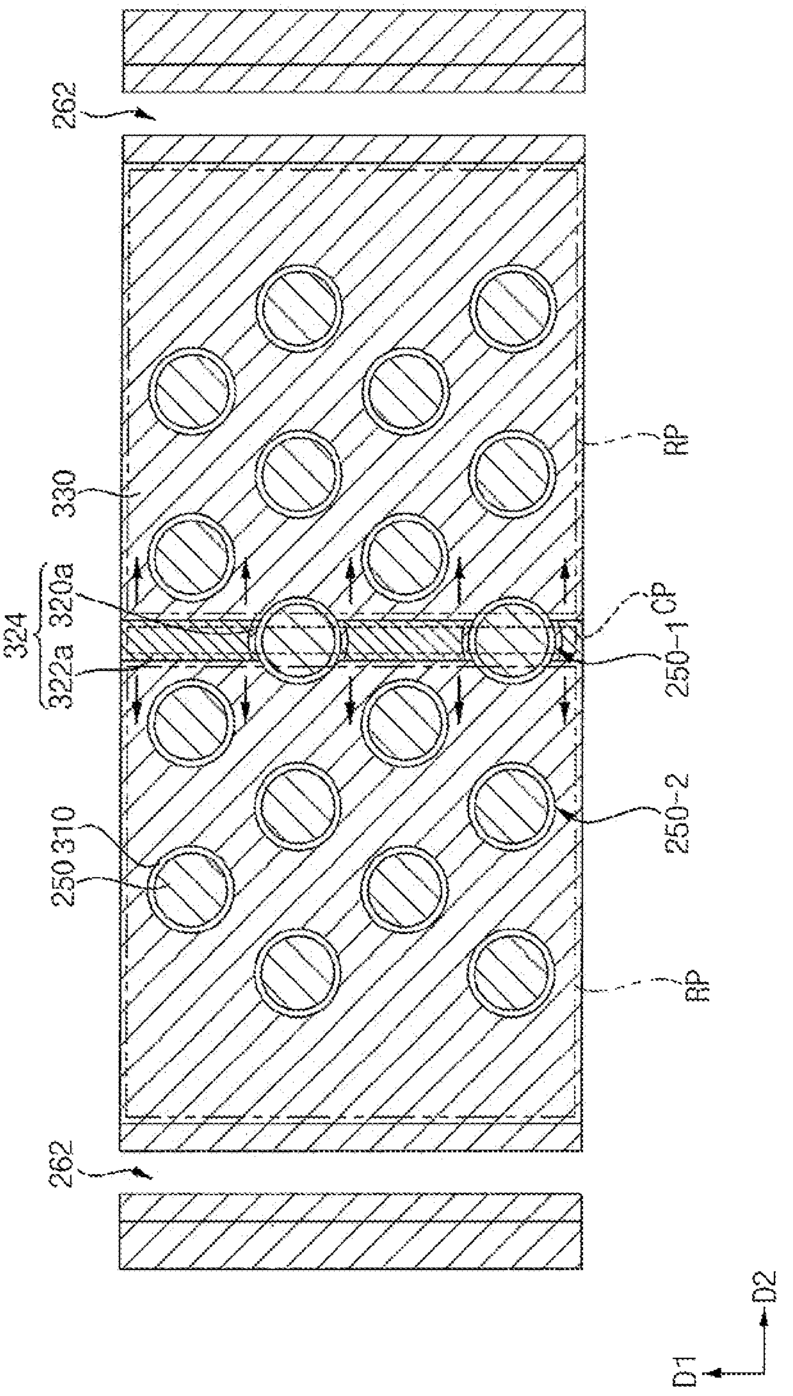

Referring to FIGS. 20 and 21, a second metal layer 330 may be formed on the exposed second blocking dielectric layer 310 and the first metal pattern structure 324 to completely fill the second gap 300 (e.g., fill the remainder portion RP of the second gap 300).

The second metal layer 330 may be formed by a selective atomic layer deposition process. That is, the second metal layer 330 may be formed by an atomic layer deposition process in which a difference between a deposition rate on an upper surface of the oxide and a deposition rate on an upper surface of a metal material may be great. Particularly, the second metal layer 330 may be formed to have a low deposition rate on the upper surface of the oxide, and may be formed to have a high deposition rate on the upper surface of the metal material.

When the above process is performed, a metal material may be selectively deposited in a vertical direction (i.e., a second direction) from the both sidewalls of the first metal pattern structure 324 positioned at the central portion in the second direction of the second gap 300 to form the second metal layer 330. In some example embodiments, the second metal layer 330 may hardly be formed on the surface of the second blocking dielectric layer 310. Thus, the second metal layer 330 may be laterally deposited in only one direction (i.e., the second direction) from the both sidewalls of the first metal pattern structure 324, and the second metal layer 330 may not be deposited in the second gap 300 in the vertical direction from the surface of the substrate. The void formed at an interface between layers grown in different directions may not be generated in the second metal layer 330. In addition, a grain boundary formed at the interface between layers grown in different directions may not be generated in the second metal layer 330. The second metal layer 330 may be hardly deposited in the vertical direction in the second gap 300, and may be deposited only in the second direction. Therefore, a grain size of the second metal layer 330 may be increased by the vertical height of the second gap 300. That is, a maximum grain size of the second metal layer 330 may be substantially the same (e.g., substantially a same magnitude as a vertical height (e.g., a magnitude of a vertical height in the vertical direction) of the second metal layer 330. The second metal layer 330 may directly contact the second blocking dielectric layer 310 and the first metal pattern structure 324. That is, the barrier metal pattern may not be formed between the second metal layer 330 and the second blocking dielectric layer 310.

Since at least 60% of the second gap 300 may be filled with the second metal layer 330, preferably, the second metal layer 330 may have a low resistance. "Resistance" may be referred to herein interchangeably as "electrical resistance," or the like. In some example embodiments, the second metal layer 330 may include a metal material having a resistance equal to or lower than that of the first metal pattern 322*a*.

In some example embodiments, the second metal layer 330 may include, e.g., molybdenum, tungsten, cobalt, or ruthenium. In some example embodiments, the second metal layer 330 may include a material different from that of the first metal pattern 322*a*. In some example embodiments, the second metal layer 330 may include a material substantially the same as that of the first metal pattern 322*a*.

For example, the first metal pattern 322*a* may include tungsten, and the second metal layer 330 may include molybdenum.

When the molybdenum is formed by the atomic layer deposition process, the molybdenum may be formed to have a low deposition rate on the upper surface of the oxide, and the molybdenum may be formed to have a high deposition rate on the upper surface of the metal material. Therefore, the molybdenum may be selectively deposited on the upper surface of the metal material. That is, the metal material under the molybdenum may serve as a seed layer, and the molybdenum may be deposited only on the seed layer. In the atomic layer deposition process for forming the molybdenum, a molybdenum precursor may be used, e.g., MoOxCly, MoClx or MOFx. That is, a cycle including an introduction of the molybdenum precursor, a purging, an introduction of reducing agent and a purging process may be repeatedly performed to form the molybdenum.

When each of the molybdenum and tungsten is formed to have a vertical thickness less than about 100 nm, a resistance of the molybdenum may be lower than a resistance of the tungsten.

In the second gap 300, the second metal layer 330 may be formed on both sidewalls of the first metal pattern structure 324. In some example embodiments, in the second gap 300, the length in the second direction of the first metal pattern structure 324 may be less than a sum of the lengths in the second direction of the second metal layer 330. In the second gap 300, a volume of the first metal pattern structure 324 may be less than a volume of the second metal layer 330.

Figure 22:
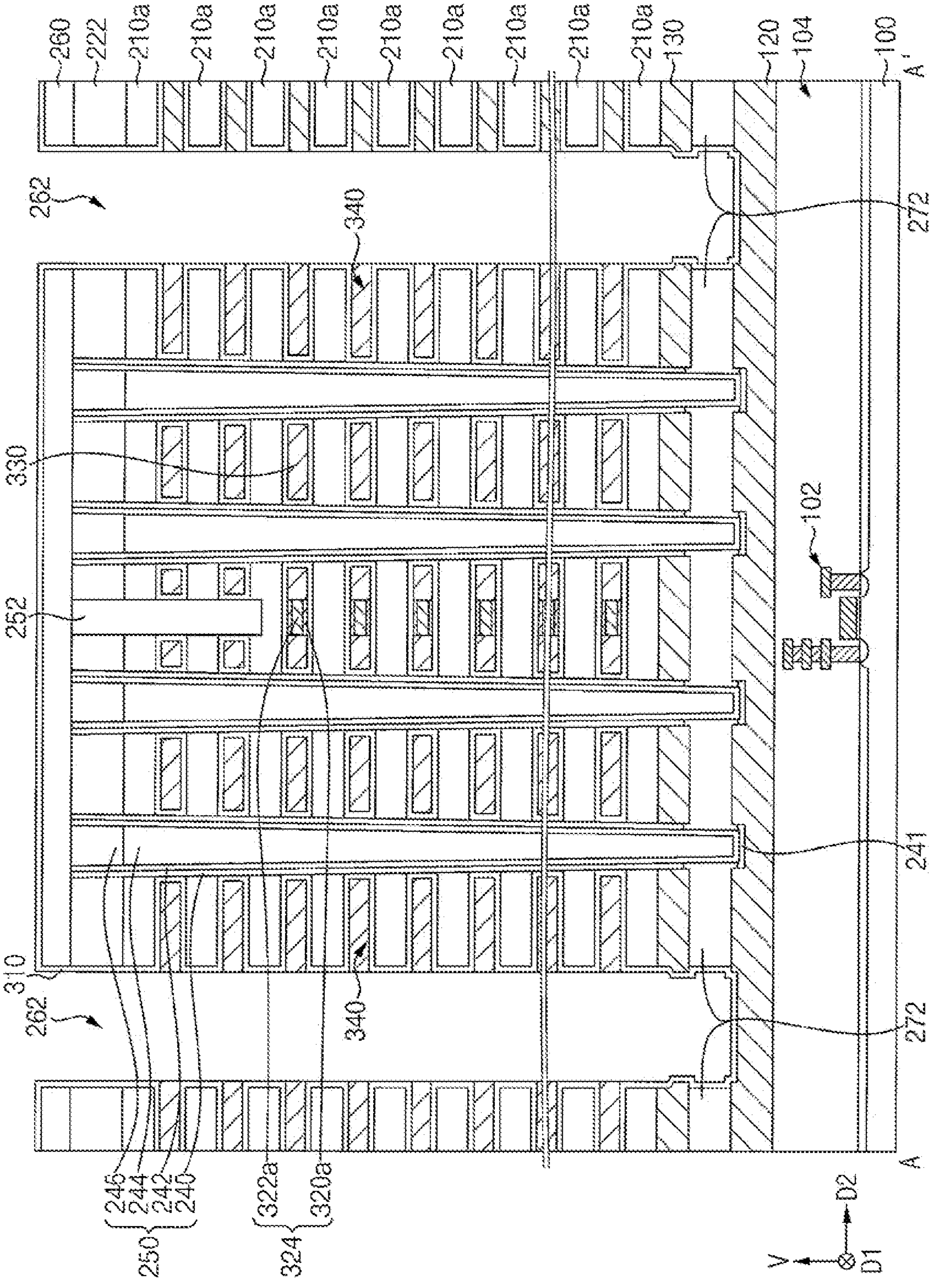
Figure 23:
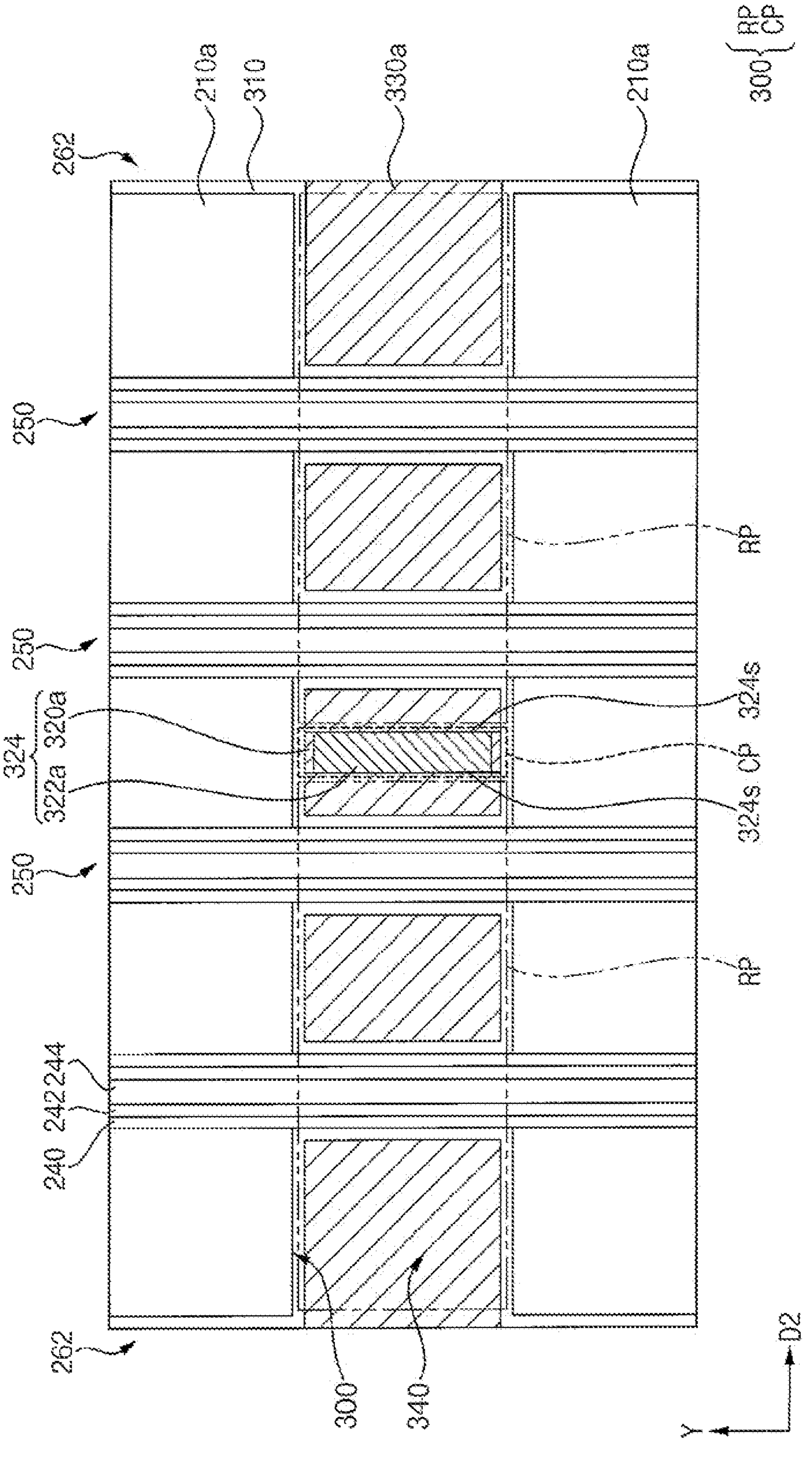
Figure 24:
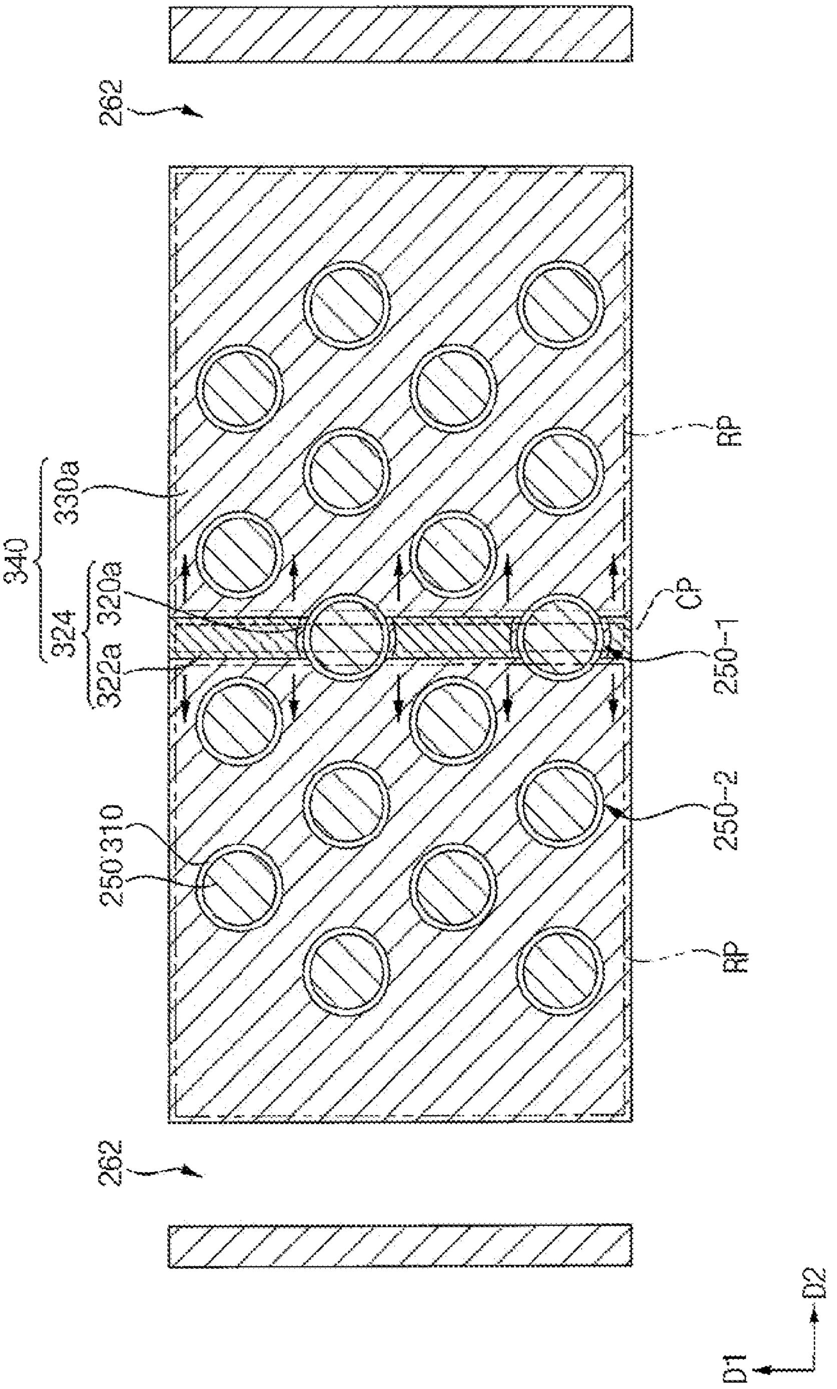

Referring to FIGS. 22 to 24, the second metal layer 330 on the surface of the trench 262 may be etched to form a second metal pattern 330*a* on the both sidewalls (e.g., opposite sidewalls 324*s* of the first metal pattern structure 324. The second metal pattern 330*a* may fill the second gap 300. As shown, the first metal pattern structure 324 may fill the central portion CP of the second gap 300 and the second metal pattern 330*a* may be formed on opposite sidewalls 324*s* of the first metal pattern structure 324 in the second gap 300 such that the first metal pattern structure 324 is at the central portion of the second gap 300 and is spaced apart from (e.g., isolated from direct exposure to) the trenches 262 at the side boundaries of the second gap 300 in the second direction D2 by at least the second metal pattern 330*a* and further such that the second metal pattern 330*a* at least partially fills the remainder portion(s) RP excluding the central portion CP at opposite sides thereof in the second direction D2 and thus excluding the first metal pattern structure 324 at opposite sides of the first metal pattern structure 324 in the second direction D2 such that the second metal pattern 330*a* may be at least partially exposed to the trenches 262 at the side boundaries of the second gap 300 in the second direction D2 and such that the first metal pattern structure 324, based on being at the central portion CP of the second gap 300, may be at least partially surrounded between separate portions of the second metal pattern 330*a* in the second direction D2 within the second gap 300. The etching process may include an isotropic etching process. For example, the etching process may include wet etching or isotropic dry etching.

After the etching process, the second blocking dielectric layer 310 may be exposed by the surface of the trench 262. In some example embodiments, in the etching process, the second metal layer 330 at the inlet of the second gap 300 may be partially removed.

Therefore, a gate structure 340 including the first metal pattern structure 324 and the second metal pattern 330*a* may be formed in the second gap 300. As shown in at least FIG. 24, in some example embodiments, at least a portion of the outer walls of one or more first channel structures 250-1 of the channel structures 250 at the central portion CP of the second gap 300 in the second direction D2 are surrounded by the first metal pattern structure 324, and outer walls of one or more second channel structures 250-2 of the channel structures 250 in the second gap 300 are surrounded by only the second metal pattern 330.

Figure 25:
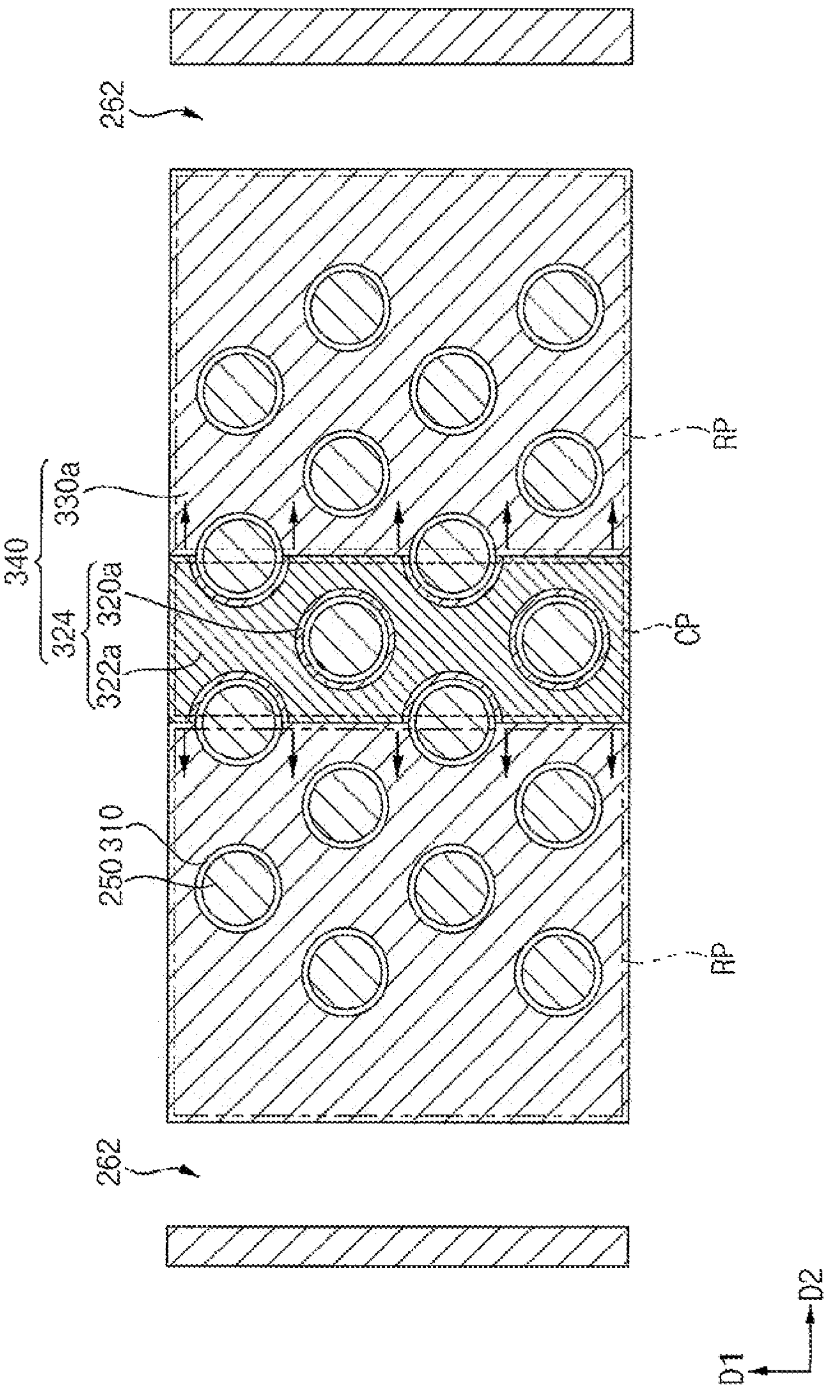

As shown in FIG. 25, in the gate structure 340, when the length in the second direction of the first metal pattern structure 324 increases, the length in the second direction of the second metal pattern 330*a* may be decreased. In some example embodiments, when the length in the second direction of the first metal pattern structure 324 increases, at least a portion of the channel structure 250 positioned at the central portion in the second direction of the second gap 300 may be surrounded by only the first metal pattern structure 324.

As the second metal pattern 330*a* may be formed by the deposition only in the second direction from both sidewalls of the first metal pattern structure 324, voids may not be generated in the second metal pattern 330*a*.

If the void is included in the gate structure 340, deposition gas, hydrogen gas, and/or reaction byproducts may remain in the void after the deposition process. The first insulation patterns 210*a* positioned above and below the gate structure 340 may be partially etched by the gases in the void, so that a slit or a crack may be formed in the first insulation pattern 210*a* or the first insulation pattern 210*a* may be leaned. In addition, when the void is included in the gate structure 340, a volume of the metal material in the gate structure 340 may be decreased. Therefore, a resistance of the gate structure 340 may be increased. However, in some example embodiments, the void may not be included in the gate structure 340, so that the first insulation pattern 210*a* may have a stable structure and the gate structure 340 may have a low resistance. Accordingly, a reliability and/or performance of the vertical semiconductor device may be improved due to the low resistance. Additionally, an absence of voids in the gate structure 340 may cause a reduced likelihood of defects in the resultant vertical semiconductor device including the gate structure 340 and thus improve reliability of the vertical semiconductor device. Accordingly, it will be understood that a vertical semiconductor device having the gate structure 340 (e.g., first metal pattern structure 324 and second metal pattern 330*a*) according to any of the example embodiments may have improved reliability and/or performance, as the resultant structure of the gate structure having the first metal pattern structure 324 and second metal pattern 330*a* may configure the vertical semiconductor device to have low resistance and a reduced likelihood of defects due to an absence of voids in the gate structure 340 due to the resultant structure of the first metal pattern structure 324 and second metal pattern 330*a* according to any of the example embodiments.

According to the processes, the first sacrificial patterns 220*a* included in the mold structure may be replaced with the gate structure 340. The mold structure may be replaced with a pattern structure including the first insulation pattern 210*a* and the gate structure 340 stacked.

Figure 26:
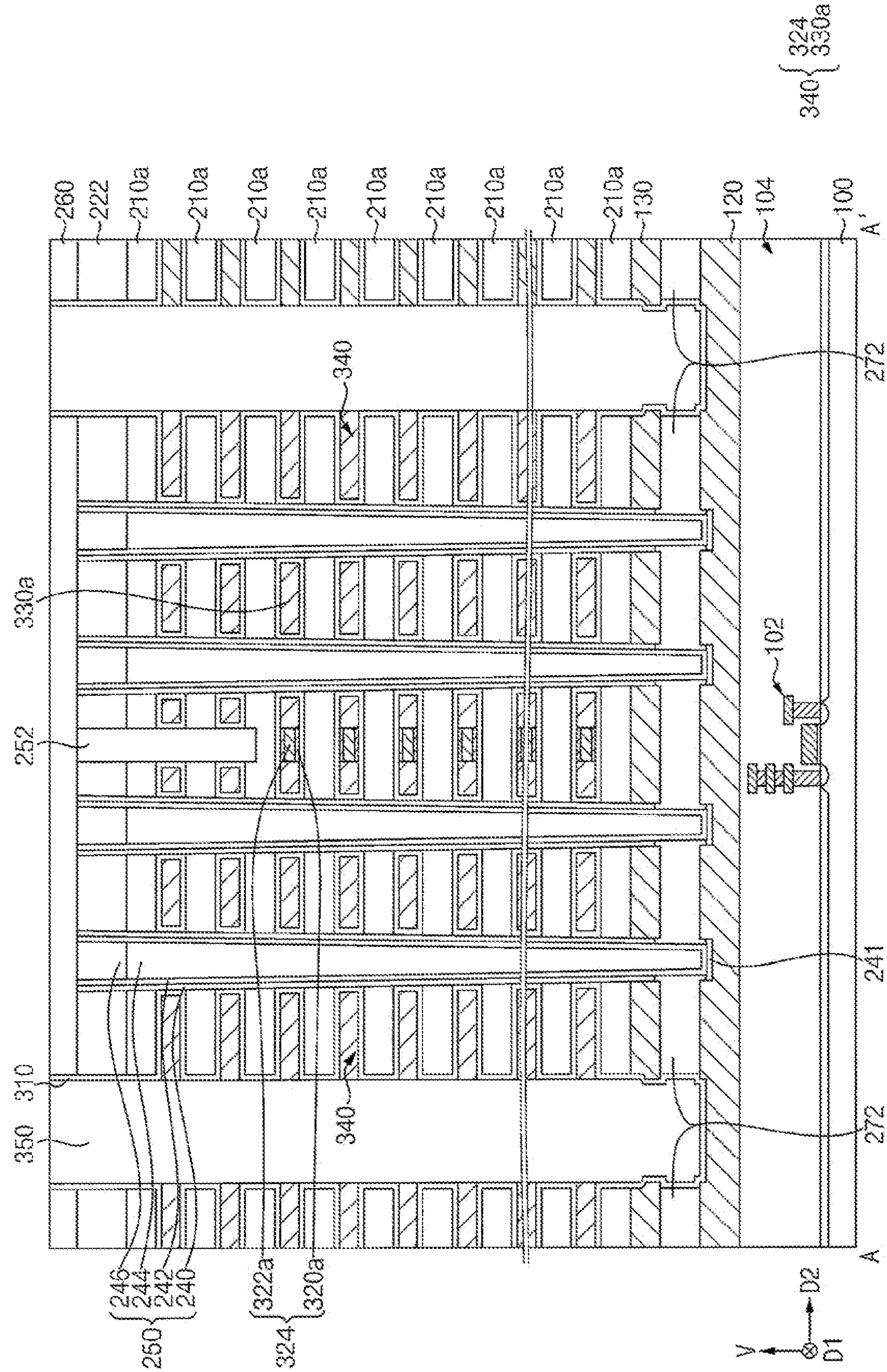

Referring to FIG. 26, an insulation layer may be formed on the first insulating interlayer 260 to fill the trench 262. The insulation layer may be planarized to form a second insulation pattern 350 filling the trench 262. The second insulation pattern 350 may include silicon oxide. In the planarization process, the second blocking dielectric layer 310 on the first insulating interlayer 260 may be removed.

Thereafter, although not shown, a second insulating interlayer may be formed on the first insulating interlayer 260 and the second insulation pattern 350, and then contact plug contacting the capping pattern 246 may be formed through the second insulating interlayer. Further, a bit line may be formed on an upper surface of the contact plug.

By performing the above processes, a vertical semiconductor device may be manufactured.

Meanwhile, the vertical semiconductor device manufactured by the processes may have following structural characteristics. Structural features of the vertical semiconductor device may be described with reference to FIGS. 23 to 26.

Referring to FIGS. 23 to 26, in the vertical semiconductor device, a lower circuit pattern 102 may be formed on a semiconductor substrate 100, and a lower insulating interlayer 104 may be formed to cover the lower circuit pattern 102. The lower circuit pattern 102 may constitute peripheral circuits in the vertical semiconductor device. A common electrode plate 120 may be formed on the lower insulating interlayer 104.

Pattern structures in which gate structures 340 and first insulation patterns 210*a* are repeatedly and alternately stacked in the vertical direction may be formed on the common electrode plate 120. An upper insulation layer 222 may be formed on an uppermost portion of the pattern structure.

The pattern structure may extend in the first direction D1. A plurality of the pattern structure may be arranged in the second direction D2. A trench 262 extending in the first direction D1 may be disposed between the pattern structures. The trenches 262 may be disposed at both sides of the pattern structure. An upper portion of the common electrode plate 120 may be exposed on a bottom of the trench 262. Channel structures 250 may pass through the pattern structure, and may extend in the vertical direction. The channel structure 250 may extend to an upper portion of the common electrode plate 120.

The channel structure 250 may be formed in a channel hole 230 passing through the pattern structure. The channel structure 250 may include a charge storage structure 240, a channel 242, a first filling insulation pattern 244, and a capping pattern 246. The charge storage structure 240 may include a first blocking dielectric layer pattern (240*a*, referred to FIG. 9), a charge storage pattern (240*b*, referred to FIG. 9), and a tunnel insulation pattern (240*c*, referred to FIG. 9) sequentially stacked on a sidewall of the channel hole 230.

The channel 242 may be conformally formed on an upper surface of the tunnel insulation pattern 240*c*, and may have a cylindrical shape. The first filling insulation pattern 244 may be formed on the channel 242, and may fill a remaining inner space of the channel hole 230. The capping pattern 246 may be formed at an upper portion of the channel hole 230, and may be formed on the charge storage structure 240, the channel 242, and the first filling insulation pattern 244.

A channel connection pattern 272 and a first support layer 130 may be formed between the common electrode plate 120 and the pattern structure in the vertical direction. The channel connection pattern 272 may directly contact an upper surface of the common electrode plate 120. The channel connection pattern 272 may directly contact lower sidewalls of the channels 242 in the channel structures 250. Therefore, the channel connection pattern 272 may electrically connect the channels 242 to each other. Also, the channels 242 may be electrically connected to the common electrode plate 120 by the channel connection pattern 272. The first support layer 130 may be formed on the channel connection pattern 272. The pattern structure may be disposed on the first support layer 130.

In the pattern structure, the first insulation patterns 210*a* may be spaced apart from each other in the vertical direction. The first insulation patterns 210*a* may extend in the first direction. In some example embodiments, the first insulation patterns 210*a* may include silicon oxide.

The gate structure 340 may be interposed between adjacent first insulation patterns 210*a* in the vertical direction. The gate structure 340 may contact sidewalls of the channel structures 250. The gate structure 340 may extend in the first direction.

When a vertical thickness of the gate structure 340 is thick, a height of the pattern structure may be increased. When the vertical thickness of the gate structure 340 is thin, a resistance of the gate structure 340 may be increased. In addition, processes for forming the gate structure 340 may not be easy. In some example embodiments, the vertical thickness of the gate structure 340 may be in a range of about 10 nm to about 100 nm.

In some example embodiments, a lowermost gate structure 340 may serve as a ground select line (GSL), and one or two uppermost gate structures 340 may serve as a string select line (SSL). Also, the gate structures 340 between the ground selection line and the string selection line may serve as word lines, respectively. A separation pattern 252 including an insulation material may be further formed between the string selection lines SSL in the second direction.

The gate structure 340 may fill a second gap 300 between the first insulation patterns 210*a* spaced apart in the vertical direction. The second gap 300 may be positioned between the trenches 262 in the second direction. The channel structures 250 may vertically pass through the first insulation patterns 210*a* and the second gap 300, and may be regularly arranged. A portion of an outer wall of the channel structure 250 may be exposed by the second gap 300.

A second blocking dielectric layer 310 may be conformally formed on a surface of the trench 262, surfaces of the first insulation patterns 210*a* in the second gap 300, and the outer wall of the channel structure 250. The second blocking dielectric layer 310 may include an oxide. The second blocking dielectric layer 310 may include a metal oxide such as aluminum oxide, hafnium oxide, zirconium oxide, or the like. The gate structure 340 may be formed on the second blocking dielectric layer 310.

The gate structure 340 may include a first metal pattern structure 324 and a second metal pattern 330*a*. The first metal pattern structure 324 may partially fill the second gap 300, and may be disposed at a central portion in the second direction of the second gap 300. The first metal pattern structure 324 may extend in the first direction. Therefore, a left inside and a right inside of the second gap 300 may be separated by the first metal pattern structure 324. Both sidewalls of the first metal pattern structure 324 may be exposed by the second gap 300.

In some example embodiments, the first metal pattern structure 324 may include a first metal pattern 322*a* and a barrier metal pattern 320*a* surrounding at least a partial surface of the first metal pattern 322*a*.

In some example embodiments, the barrier metal pattern 320*a* may be formed on the surface of the first insulation pattern 210*a* in the second gap 300 and on the outer wall of the channel structure 250. Therefore, upper and lower surfaces of the barrier metal pattern 320*a* may not contact a metal material. An upper surface and a lower surface of the first metal pattern 322*a* may contact the barrier metal pattern 320*a*.

The first metal pattern 322*a* may include, e.g., tungsten, molybdenum, cobalt, or ruthenium. The barrier metal pattern 320*a* may include, e.g., titanium nitride, tantalum nitride, titanium, tantalum, tungsten nitride, tantalum silicon nitride, titanium, or titanium nitride.

A length in the second direction of the first metal pattern 322*a* may be about 5% to about 40% of a total length in the second direction of the second gap 300. A void may not be included in the first metal pattern 322*a*.

The second metal pattern 330*a* may be formed on both sidewalls of the first metal pattern structure 324, and may completely fill the second gap 300.

The second metal pattern 330*a* may directly contact the second blocking dielectric layer 310 and the first metal pattern structure 324. That is, upper and lower surfaces of the second metal pattern 330*a* may contact the second blocking dielectric layer 310, and one sidewall of the second metal pattern 330*a* may contact the first metal pattern structure 324. The upper surface and the lower surface of the second metal pattern 330*a* may contact an insulation material. Also, a barrier metal pattern may not be formed between the second metal pattern 330*a* and the second blocking dielectric layer 310.

The second metal pattern 330*a* may include a metal material formed by growing in the second direction from both sidewalls of the first metal pattern structure 324. As the second metal pattern 330*a* may be formed by a deposition only in the second direction from both sidewalls of the first metal pattern structure 324, void formed at an interface between layers grown in different directions may not be generated in the second metal layer 330. In addition, a grain boundary formed at the interface between layers grown in the different directions may not be generated in the second metal pattern 330*a*. A grain size of the second metal pattern 330*a* may be increased by a vertical height of the second gap 300. That is, a maximum grain size of the second metal pattern 330*a* may be substantially the same as a vertical height of the second metal pattern 330*a*.

In some example embodiments, the second metal pattern 330*a* may include, e.g., molybdenum, tungsten, cobalt, or ruthenium. The second metal pattern 330*a* may include a material different from that of the first metal pattern 322*a*. In some example embodiments, the second metal pattern 330*a* may include a material substantially the same as that of the first metal pattern 322*a*.

In some example embodiments, a sum of the lengths in the second direction of the second metal pattern 330*a* included in the gate structure 340 may be greater than about 60% of the length in the second direction of the gate structure 340 (i.e., the length in the second direction of the second gap). That is, the length in the second direction of the first metal pattern structure 324 may be less than the sum of the lengths in the second direction of the second metal pattern 330*a*. Also, in the second gap 300, a volume of the first metal pattern structure 324 may be less than a volume of the second metal pattern 330*a*.

Since the volume of the second metal pattern 330*a* in the gate structure 340 is relatively great, preferably, the second metal pattern 330*a* may have a low resistance. In some example embodiments, the second metal pattern 330*a* may include a metal material having a resistance equal to or lower than that of the first metal pattern 322*a*.

For example, the first metal pattern 322*a* may include a tungsten pattern, and the second metal pattern 330*a* may include a molybdenum pattern. A vertical thickness of each of the molybdenum pattern and the tungsten pattern may be less than about 100 nm, in this case a resistance of the molybdenum pattern may be lower than a resistance of the tungsten pattern.

In some example embodiments, at least a portion of the outer wall of the channel structure 250 passing through the central portion in the second direction of the gate structure 340 may be surrounded by the first metal pattern structure 324. In some example embodiments, outer walls of ones of the channel structures 250 passing through the gate structure 340 may be surrounded by only second metal pattern 330*a*. For example, the second metal pattern 330*a* may surround outer walls the channel structures 250 passing through edge portions in the second direction of the gate structure.

As shown in FIGS. 24 and 25, ones of the channel structures 250 passing through the gate structure 340 may be surrounded by the first metal pattern structure 324 and the second metal pattern 330*a*. As shown in FIG. 25, ones of the channel structures 250 passing through the gate structure 340 may be surrounded by only the first metal pattern structure 324.

A second insulation pattern 350 may fill the trench 262. The second insulation pattern 350 may include silicon oxide.

Although not shown, a second insulating interlayer may be formed on the first insulating interlayer 260 and the second insulation pattern 350. A contact plug may be formed through the second insulating interlayer, and the contact plug may contact the capping pattern 246. Further, a bit line may be formed on the contact plug, and the bit line may contact an upper surface of the contact plug.

Figure 27:
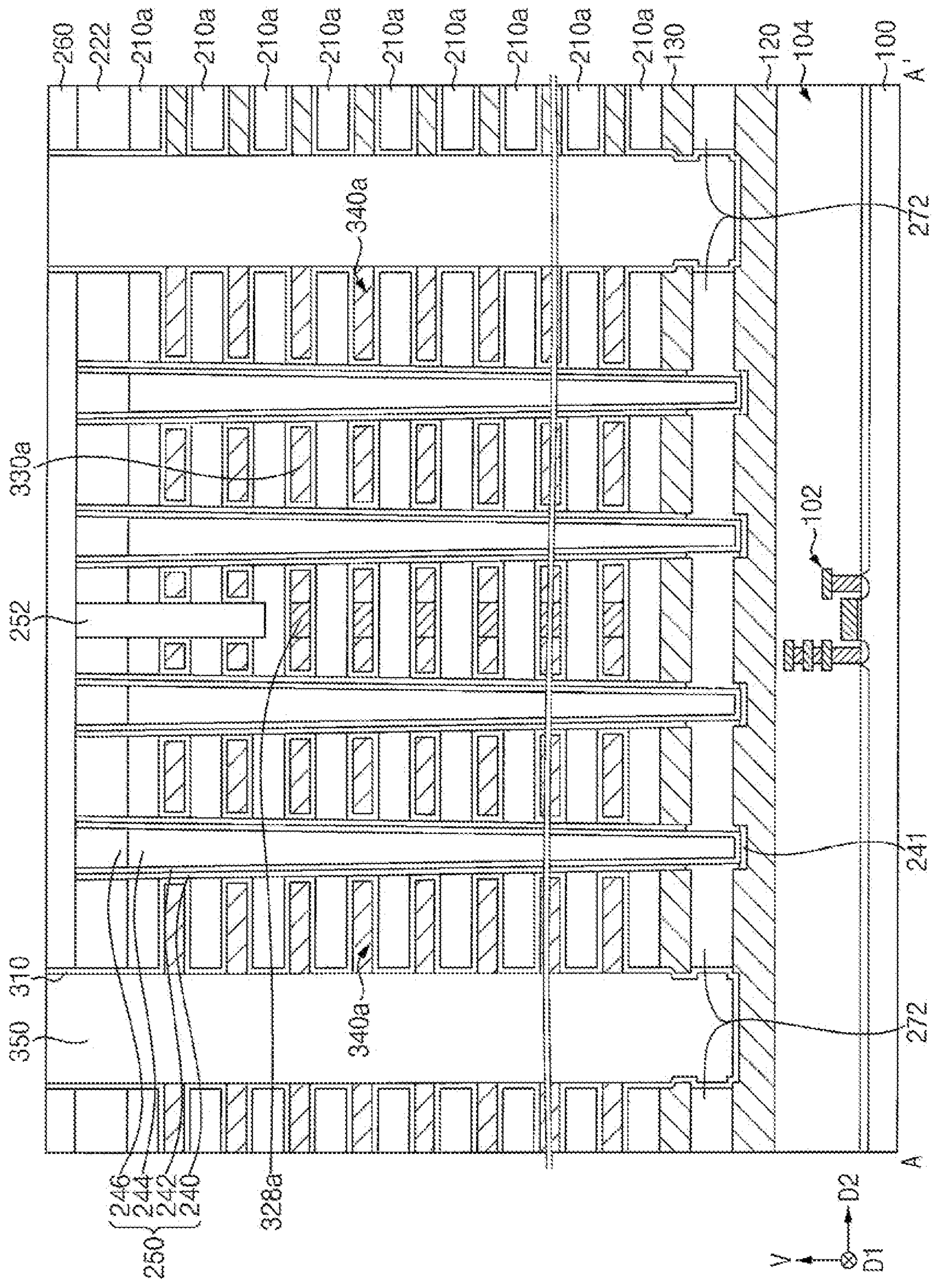
Figure 28:
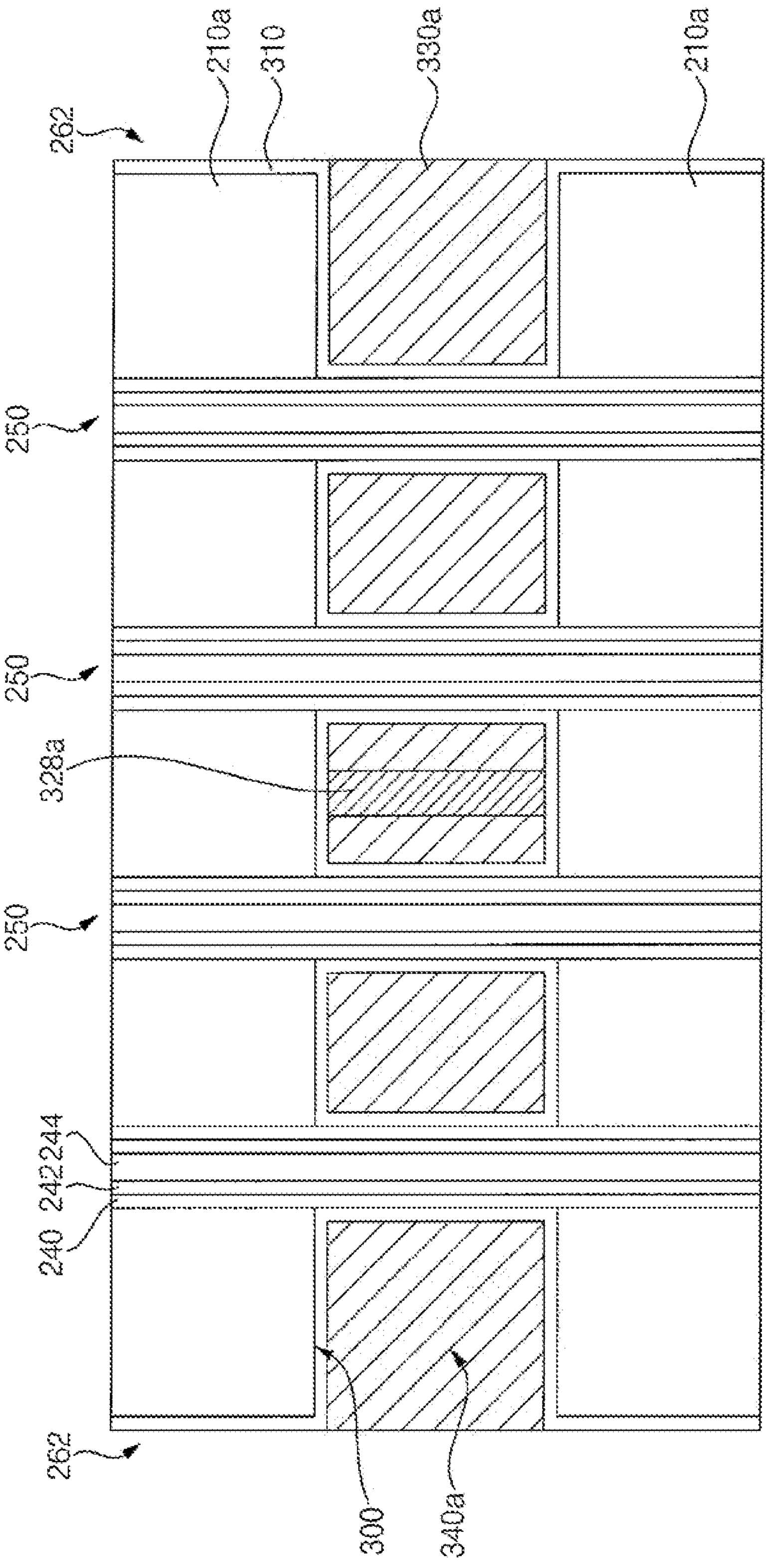

FIGS. 27 and 28 are a cross-sectional view and an enlarged cross-sectional view of a vertical semiconductor device in accordance with some example embodiments.

The vertical semiconductor device may be substantially the same as or similar to the vertical semiconductor device illustrated in FIGS. 23 to 26, except for a stacked structure of the gate structure. Therefore, the gate structure may be mainly described.

Referring to FIGS. 27 and 28, the gate structure 340*a* may include a first metal pattern 328*a* and a second metal pattern 330*a*. The first metal pattern 328*a* may partially fill the second gap 300, and may be disposed at the central portion in the second direction of the second gap 300. The first metal pattern 328*a* may extend in the first direction.

In some example embodiments, the first metal pattern 328*a* may include a barrier metal material. The first metal pattern 328*a* may include, e.g., titanium nitride, tantalum nitride, titanium, tantalum, tungsten nitride, tantalum silicon nitride, titanium, or titanium nitride.

The length in the second direction of the first metal pattern 328*a* may be about 5% to about 40% of the total length in the second direction of the second gap 300. A void may not be included in the first metal pattern 328*a*.

The second metal pattern 330*a* may be formed on both sidewalls of the first metal pattern 328*a*, and may completely fill the second gap 300.

The second metal pattern 330*a* may directly contact the second blocking dielectric layer 310 and the first metal pattern 328*a*. That is, upper and lower surfaces of the second metal pattern 330*a* may contact the second blocking dielectric layer 310, and one sidewall of the second metal pattern may contact the first metal pattern 328a. Also, the barrier metal material may not be formed between the second metal pattern 330a and the second blocking dielectric layer 310.

The second metal pattern 330a may include a metal material formed by laterally growing (i.e., in the second direction) from both sidewalls of the first metal pattern 328a.

In some example embodiments, the second metal pattern 330a may include, e.g., molybdenum, tungsten, cobalt, or ruthenium.

The vertical semiconductor device shown in FIGS. 27 and 28 may be formed by following processes.

Figure 29:
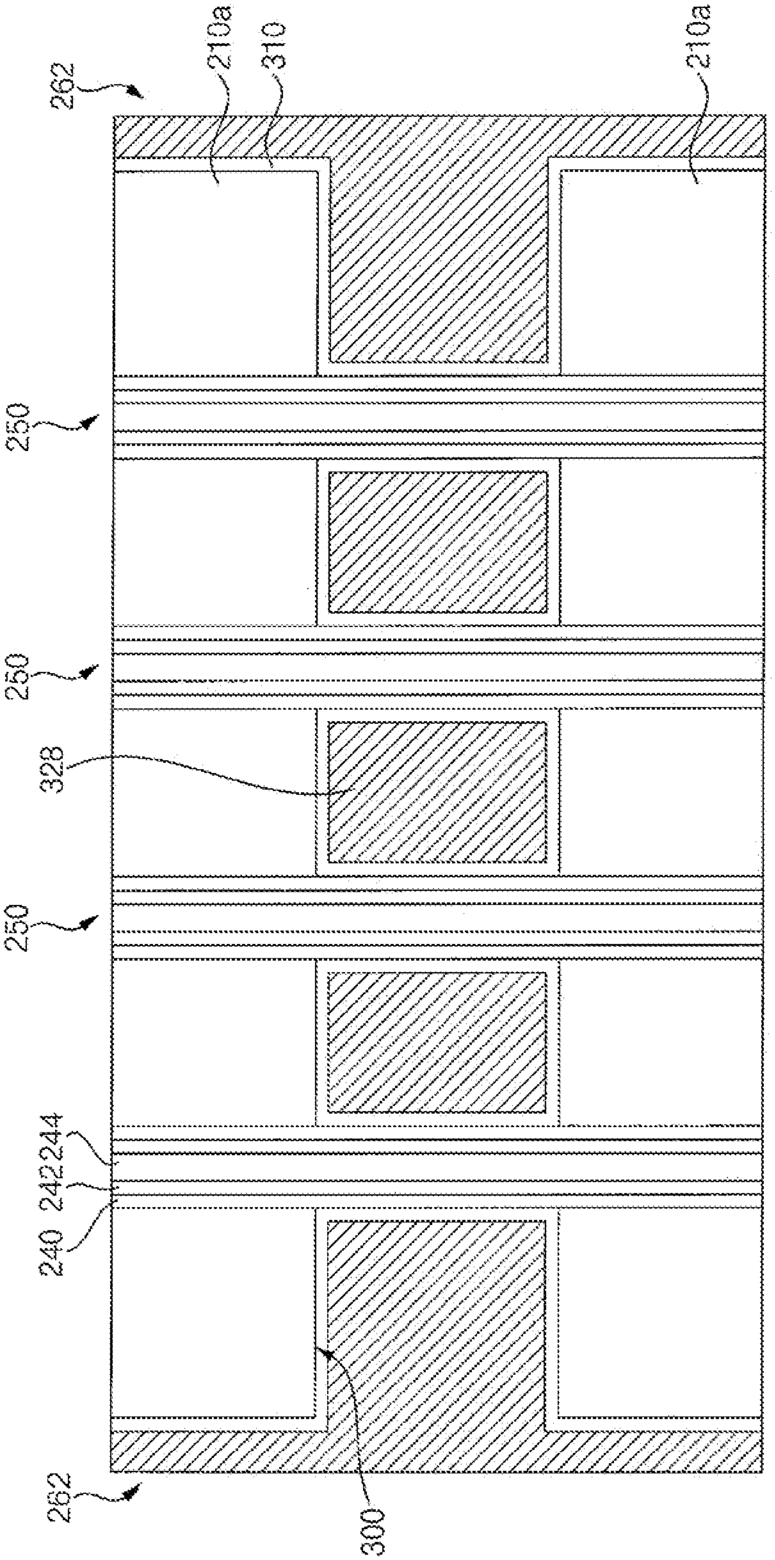
Figure 30:
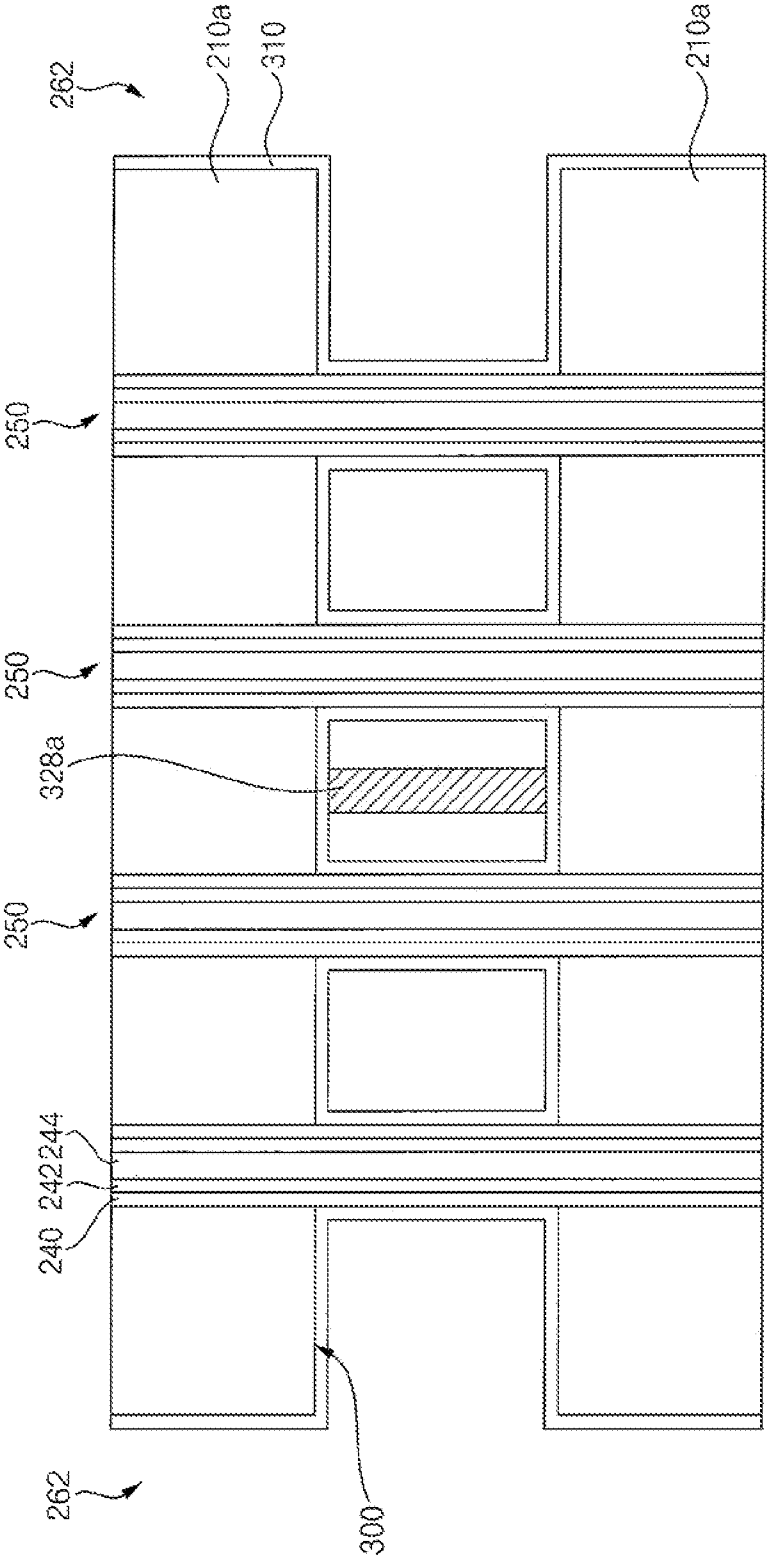
Figure 31:
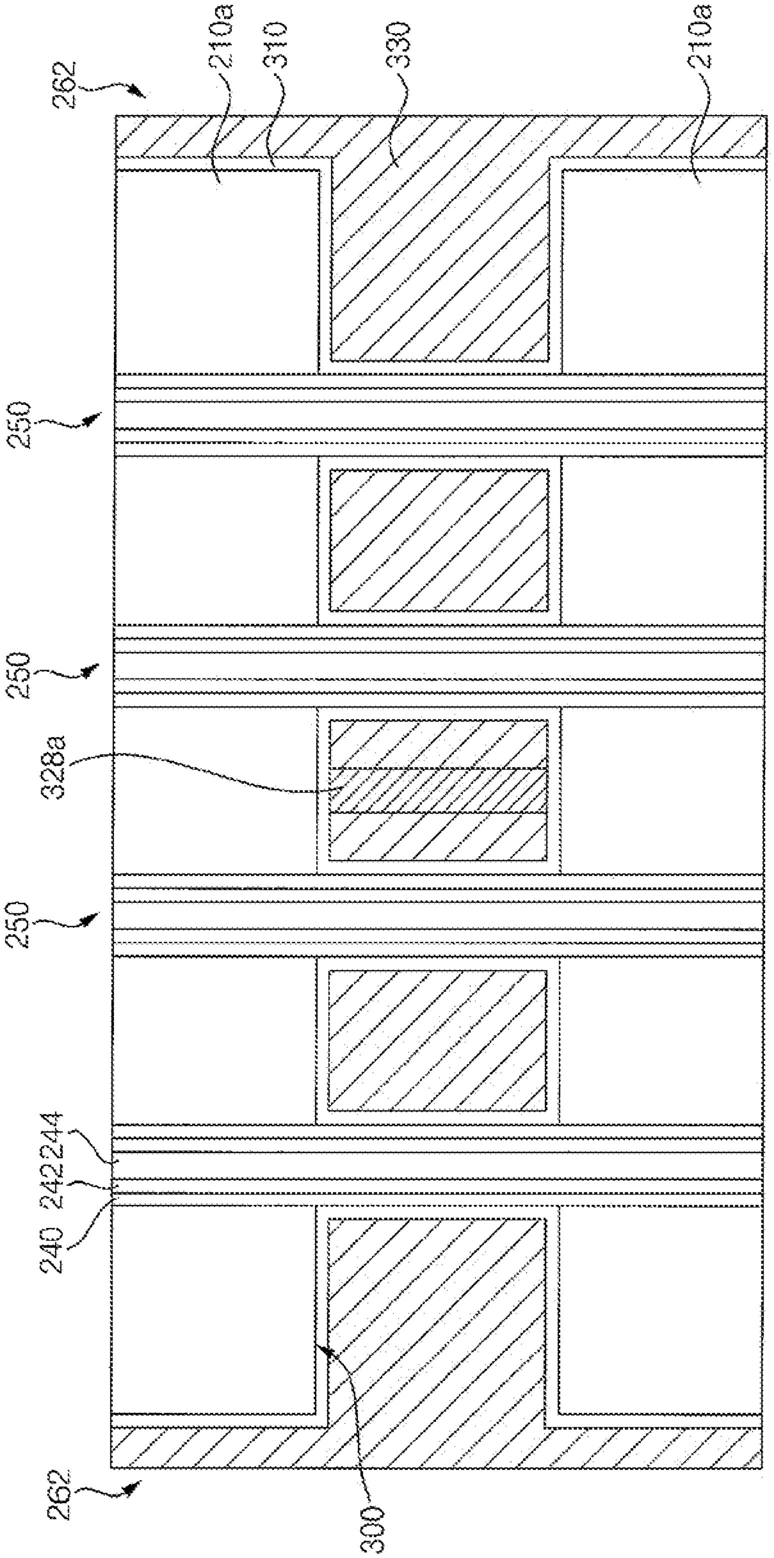

FIGS. 29, 30, and 31 are cross-sectional views illustrating a method of manufacturing a vertical semiconductor device in accordance with some example embodiments.

First, the same process as illustrated with reference to FIGS. 4 to 15 may be performed.

Referring to FIG. 29, the second blocking dielectric layer 310 may be conformally formed on the surface of the trench 262, the surfaces of the first insulation patterns 210a in the second gap 300, and the outer wall of the channel structure 250 in the second gap 300. The second blocking dielectric layer 310 may include the oxide. The second blocking dielectric layer 310 may include the metal oxide such as aluminum oxide, hafnium oxide, zirconium oxide, or the like.

A first metal layer 328 may be formed on the second blocking dielectric layer 310 to fill the second gap 300. The first metal layer 328 may include the barrier metal material. The first metal layer 328 may include, e.g., titanium nitride, tantalum nitride, titanium, tantalum, tungsten nitride, tantalum silicon nitride, titanium, or titanium nitride.

Referring to FIG. 30, the first metal layer 328 may be partially etched to form a first metal pattern 328a in the second gap 300. The etching process may include an isotropic etching process. For example, the etching process may include wet etching or isotropic dry etching.

In the etching process, only the first metal layer 328 positioned at the central portion in the second direction of the second gap 300 may remain, so that the first metal pattern 328a may be formed at the central portion in the second direction of the second gap 300. Therefore, the first metal pattern 328a may surround at least a portion of the outer wall of the channel structure 250 positioned at the central portion in the second direction of the second gap 300.

In the etching process, all voids in the first metal layer 328 may be removed. Therefore, the voids may not be included in the first metal pattern 328a.

Referring to FIG. 31, a second metal layer 330 may be formed on the second blocking dielectric layer 310 and the first metal pattern structure 324 to completely fill the second gap 300.

The second metal layer 330 may be formed by a selective atomic layer deposition process. The second metal layer 330 may be formed by an atomic layer deposition process in which a difference between a deposition rate on an upper surface of an oxide and a deposition rate on an upper surface of a metal material may be great. Particularly, the second metal layer 330 may be formed to have a low deposition rate on the upper surface of the oxide, and may be formed to have a high deposition rate on the upper surface of the metal material.

Subsequently, processes substantially the same as those illustrated with reference to FIGS. 22 to 26 may be performed to manufacture the vertical semiconductor device illustrated in FIGS. 27 and 28.

As described herein, any devices, systems, blocks, modules, units, controllers, circuits, apparatus, and/or portions thereof according to any of some example embodiments (including, without limitation, any of the example embodiments of the vertical semiconductor device 50, the memory cell array 1300, the peripheral circuit 1200, the page buffer circuit 1210, the control circuit 1220, the voltage generator 1230, the address decoder 1240, the data input/output circuit 1250, the electronic system 3000, the semiconductor device 3100, the decoder circuit 3110, the page buffer circuit 3120, the logic circuit 3130, the controller 3200, the processor 3210, the NAND controller 3220, the host interface 3230, the electronic system 4000, the main board 4001, the controller 4002, the one or more semiconductor packages 4003, the DRAM device 4004, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, controllers, circuits, apparatuses, and/or portions thereof according to any of some example embodiments, and/or any portions thereof, including for example some or all operations of any of the methods and/or processes shown in any of the drawings.

In the vertical semiconductor device in accordance with some example embodiments, defects due to void(s) in the gate structure may be decreased or prevented, thereby improving the performance and/or reliability of the vertical semiconductor device. The vertical semiconductor device may be used in various electronic products, such that said electronic products may have improved performance and/or reliability due to reduced defects in the vertical semiconductor device(s) included therein.

The foregoing is illustrative of example embodiments and is not to be construed as limiting thereof. Although some example embodiments have been described, those skilled in the art will readily appreciate that many modifications are possible in such example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to such example embodiments, as well as other example embodiments, are intended to be included within the scope of the appended claims.

What is claimed is:

1. A vertical semiconductor device, comprising:

insulation patterns that are spaced apart from each other in a vertical direction perpendicular to an upper surface of a substrate, each of the insulation patterns extending in a first direction parallel to the upper surface of the substrate;

channel structures on the substrate, the channel structures passing through the insulation patterns, the channel structures including first channel structures and second channel structures;

a first metal pattern structure including at least one first metal material, and comprising a continuous portion of the first metal pattern structure having an elongated shape extending in the first direction, wherein the first metal pattern structure is located between adjacent insulation patterns of the insulation patterns in the vertical direction; and a second metal pattern including a metal material that is different from the at least one first metal material, the second metal pattern on opposite outer sidewalls of the elongated shape of the continuous portion of the first metal pattern structure in a second direction perpendicular to the first direction and parallel to the upper surface of the substrate, such that the continuous portion of the first metal pattern structure is between and in contact with separate portions of the second metal pattern in the second direction, wherein the first metal pattern structure contacts only the first channel structures among the first channel structures and the second channel structures, wherein, in a cross-sectional view of the first metal pattern structure and the second metal pattern taken along the second direction:

a third channel structure, a fourth channel structure, and a fifth channel structure of the channel structures are arranged in sequence, the second metal pattern is between the third channel structure and the fourth channel structure, and between the fourth channel structure and the fifth channel structure, and the first metal pattern structure is present between the fourth channel structure and the fifth channel structure and absent between the third channel structure and the fourth channel structure.

2. The vertical semiconductor device of claim 1, wherein the first metal pattern structure includes a first barrier metal pattern and a first metal pattern, and wherein the first barrier metal pattern is between the first channel structures and the first metal pattern in the first direction.

3. The vertical semiconductor device of claim 2, wherein the first barrier metal pattern includes titanium, titanium nitride, tantalum, or tantalum nitride, and wherein the first metal pattern includes tungsten, cobalt, molybdenum, or ruthenium.

4. The vertical semiconductor device of claim 1, wherein the first metal pattern structure includes only a barrier metal pattern, and wherein the barrier metal pattern includes titanium, titanium nitride, tantalum, or tantalum nitride.

5. The vertical semiconductor device of claim 1, wherein the first metal pattern structure includes tungsten, and the second metal pattern includes molybdenum.

6. The vertical semiconductor device of claim 1, further comprising a blocking dielectric layer conformally on surfaces of the insulation patterns and sidewalls of the channel structures, and wherein upper and lower surfaces of the second metal pattern are in contact with the blocking dielectric layer.

7. The vertical semiconductor device of claim 1, wherein the first metal pattern structure is arranged centrally between a pair of second insulation patterns spaced apart from each other in the second direction, and wherein a length in the second direction of the first metal pattern structure is greater than 2 nm and is less than 40% of a distance in the second direction between the pair of second insulation patterns.

8. The vertical semiconductor device of claim 1, wherein a maximum grain size of the second metal pattern is a same magnitude as a magnitude of a vertical height of the second metal pattern.

9. The vertical semiconductor device of claim 1, wherein the second metal pattern has an electrical resistance lower than an electrical resistance of the first metal pattern structure.

10. A vertical semiconductor device, comprising:

first insulation patterns that are spaced apart from each other in a vertical direction perpendicular to an upper surface of a substrate, each of the first insulation patterns extending in a first direction parallel to the upper surface of the substrate;

a pair of second insulation patterns spaced apart from each other in a second direction perpendicular to the first direction and parallel to the upper surface of the substrate, wherein the second insulation patterns extend in the first direction;

channel structures on the substrate, the channel structures passing through the first insulation patterns between the pair of second insulation patterns, the channel structures including first channel structures and second channel structures;

a blocking dielectric layer conformally on surfaces of the first insulation patterns and sidewalls of the channel structures between adjacent first insulation patterns of the first insulation patterns in the vertical direction;

a first metal pattern structure including a first barrier metal pattern and a first metal pattern, the first metal pattern structure extending in the first direction parallel to the second insulation patterns and having a linear shape extending in the first direction in a plan view; and a second metal pattern on each of opposite outer sidewalls of the linear shape of the first metal pattern structure in the second direction, wherein the first metal pattern structure contacts only the first channel structures among the first channel structures and the second channel structures, wherein the first metal pattern structure is centrally between the pair of second insulation patterns and the second metal pattern at least partially fills a remainder portion of a space between the pair of second insulation patterns on opposite outer sides of the linear shape of the first metal pattern structure in the second direction, such that the second metal pattern is between the opposite outer sidewalls of the linear shape of the first metal pattern structure and the pair of second insulation patterns, and such that the first metal pattern structure is between separate portions of the second metal pattern in the second direction, and wherein one sidewall of the second metal pattern is in contact with the first metal pattern structure, and upper and lower surfaces of the second metal pattern are in contact with the blocking dielectric layer, respectively, wherein, in a cross-sectional view of the first metal pattern structure and the second metal pattern taken along the second direction:

a third channel structure, a fourth channel structure, and a fifth channel structure of the channel structures are arranged in sequence, the second metal pattern is between the third channel structure and the fourth channel structure, and between the fourth channel structure and the fifth channel structure, and the first metal pattern structure is present between the fourth channel structure and the fifth channel structure and absent between the third channel structure and the fourth second channel structure.

11. The vertical semiconductor device of claim 10, wherein the first barrier metal pattern includes titanium, titanium nitride, tantalum, or tantalum nitride, and wherein the first metal pattern includes tungsten, cobalt, molybdenum, or ruthenium.

12. The vertical semiconductor device of claim 10, wherein the second metal pattern includes tungsten, cobalt, molybdenum, or ruthenium.

13. The vertical semiconductor device of claim 10, wherein the first metal pattern includes tungsten, and wherein the second metal pattern includes molybdenum.

14. The vertical semiconductor device of claim 10, wherein a maximum grain size of the second metal pattern is a same magnitude as a magnitude of a vertical height of the second metal pattern.

15. The vertical semiconductor device of claim 10, wherein the second metal pattern has an electrical resistance lower than an electrical resistance of the first metal pattern structure.

16. A vertical semiconductor device, comprising:

a lower circuit pattern on a substrate;

a common electrode plate on the lower circuit pattern;

insulation patterns on the common electrode plate, the insulation patterns spaced apart from each other in a vertical direction perpendicular to an upper surface of the substrate, each of the insulation patterns extending in a first direction parallel to the upper surface of the substrate;

channel structures connected to the common electrode plate through the insulation patterns, each of the channel structures including a channel extending in the vertical direction, and a charge storage structure surrounding an outer wall of the channel;

a blocking dielectric layer conformally on surfaces of the insulation patterns and sidewalls of the channel structures between adjacent insulation patterns of the insulation patterns in the vertical direction;

a first metal pattern structure including at least one first metal material and extending in the first direction, wherein the first metal pattern structure is between the adjacent insulation patterns in the vertical direction; and a second metal pattern including a metal material different from the at least one first metal material, wherein the second metal pattern is on opposing second sidewalls of the first metal pattern structure in a second direction perpendicular to the first direction and parallel to the upper surface of the substrate, wherein one sidewall of the second metal pattern is in contact with the first metal pattern structure, and upper and lower surfaces of the second metal pattern are in contact with the blocking dielectric layer, respectively, and wherein, in a plan view, one or more first channel structures of the channel structures are completely surrounded by only the second metal pattern from among the first metal pattern structure and the second metal pattern, wherein, in a cross-sectional view of the first metal pattern structure and the second metal pattern taken along the second direction:

a third channel structure, a fourth channel structure, and a fifth channel structure of the channel structures are arranged in sequence, the second metal pattern is between the third channel structure and the fourth channel structure, and between the fourth channel structure and the fifth channel structure, and the first metal pattern structure is present between the fourth channel structure and the fifth channel structure and absent between the third channel structure and the fourth second channel structure.

17. The vertical semiconductor device of claim 16, wherein, in the plan view, one or more second channel structures of the channel structures are surrounded collectively by the first metal pattern structure and the second metal pattern.

* * * * *